(12) United States Patent
Hiew et al.

(10) Patent No.: US 7,878,852 B2
(45) Date of Patent: Feb. 1, 2011

(54) SINGLE CHIP UNIVERSAL SERIAL BUS (USB) PACKAGE WITH METAL HOUSING

(75) Inventors: Siew Sin Hiew, San Jose, CA (US); Jim Chin-Nan Ni, San Jose, CA (US); Abraham Chih-Kang Ma, Fremont, CA (US); Ming-Shiang Shen, Taipei Hsien (TW)

(73) Assignee: SuperTalent Electronics, Inc., San Jose, CA (US)

( * ) Notice: Subject to any disclaimer, the term of this patent is extended or adjusted under 35 U.S.C. 154(b) by 287 days.

(21) Appl. No.: 11/927,387

(22) Filed: Oct. 29, 2007

(65) Prior Publication Data

US 2008/0059680 A1 Mar. 6, 2008

Related U.S. Application Data

(60) Continuation-in-part of application No. 11/773,830, filed on Jul. 5, 2007, and a continuation-in-part of application No. 11/309,847, filed on Oct. 12, 2006, now Pat. No. 7,507,119, and a continuation-in-part of application No. 11/624,667, filed on Jan. 18, 2007, which is a division of application No. 09/478,720, filed on Jan. 6, 2000, now Pat. No. 7,257,714.

(51) Int. Cl.
*H01R 13/648* (2006.01)

(52) U.S. Cl. .................................. 439/607.01
(58) Field of Classification Search ............ 439/607.01, 439/676, 638, 607.22, 76.1, 946; 361/679.4, 361/679.58, 737
See application file for complete search history.

(56) References Cited

U.S. PATENT DOCUMENTS

| | | | | |
|---|---|---|---|---|
| 5,959,845 | A * | 9/1999 | Faucher | 361/777 |
| 6,116,962 | A * | 9/2000 | Laity | 439/676 |
| 7,407,393 | B2 | 8/2008 | Ni et al. | |
| 7,420,803 | B2 | 9/2008 | Hsueh et al. | |
| 2002/0001175 | A1* | 1/2002 | Unrein | 361/687 |

* cited by examiner

*Primary Examiner*—Edwin A. Leon
(74) *Attorney, Agent, or Firm*—Maryam Imam; IPxLAW Group LLP

(57) ABSTRACT

A Universal Serial Bus (USB) memory card includes a tube metal housing that is rectangularly-shaped and a Chip-On-Board (COB)-Universal Serial Bus (USB) device and a carrier substrate having a U-block disposed on one side of thereof and vertically extending upwardly from a bottom surface of the U-block, the COB-USB device positioned on the carrier substrate forming a USB card sub-assembly, the USB card sub-assembly being securely located inside the metal housing with the U-block serving to stop the COB-USB device from slipping out of the metal housing.

19 Claims, 10 Drawing Sheets

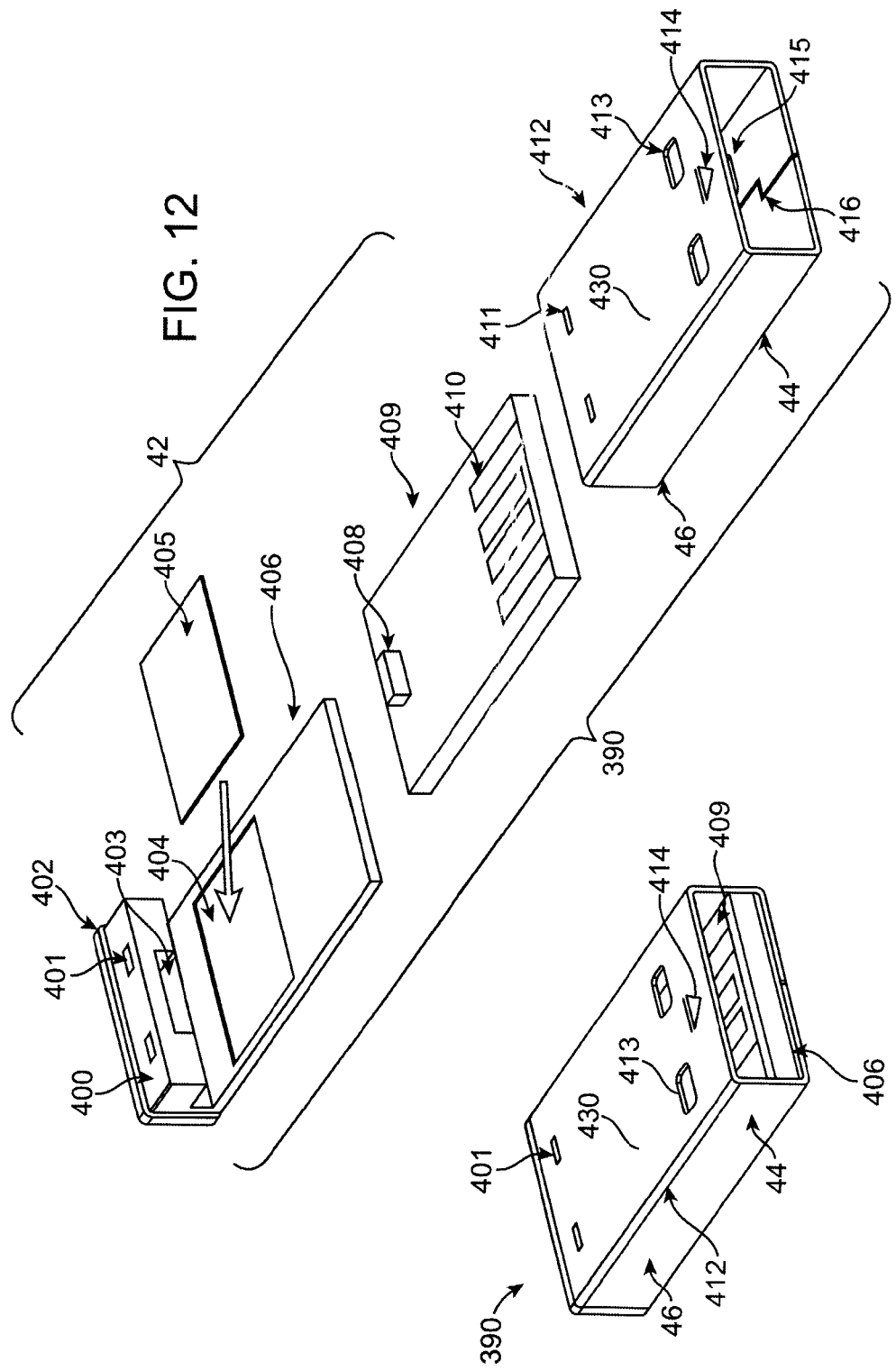

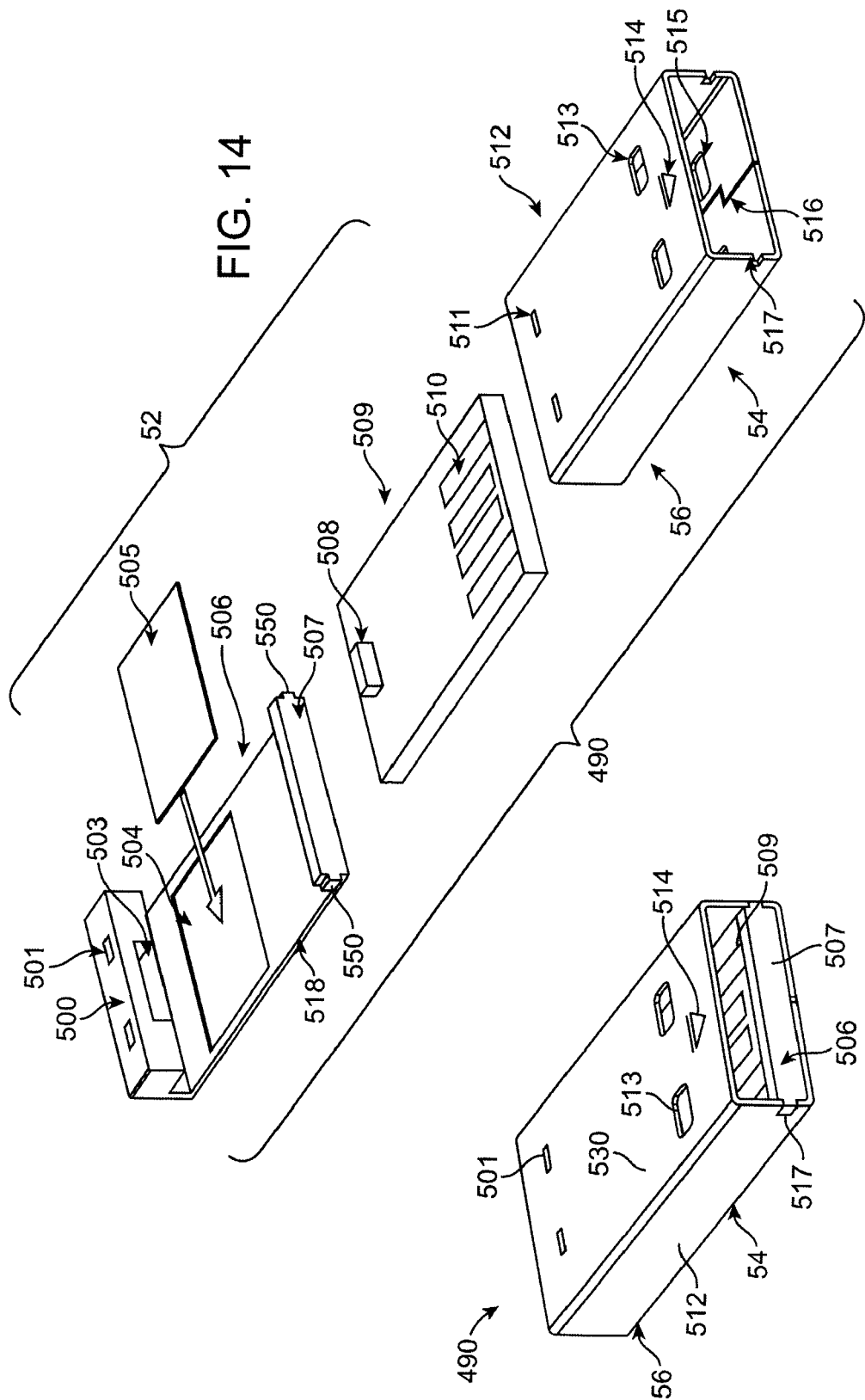

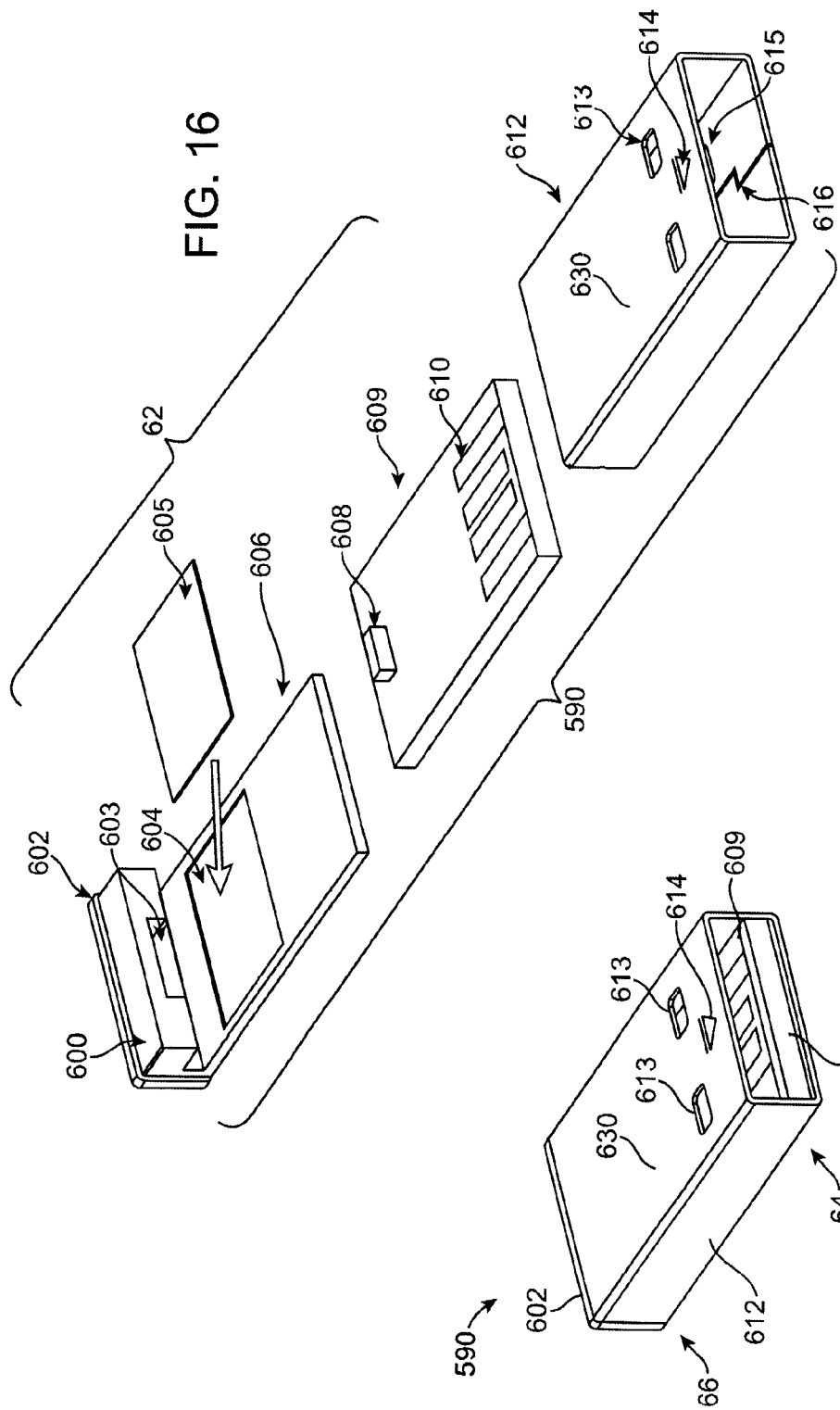

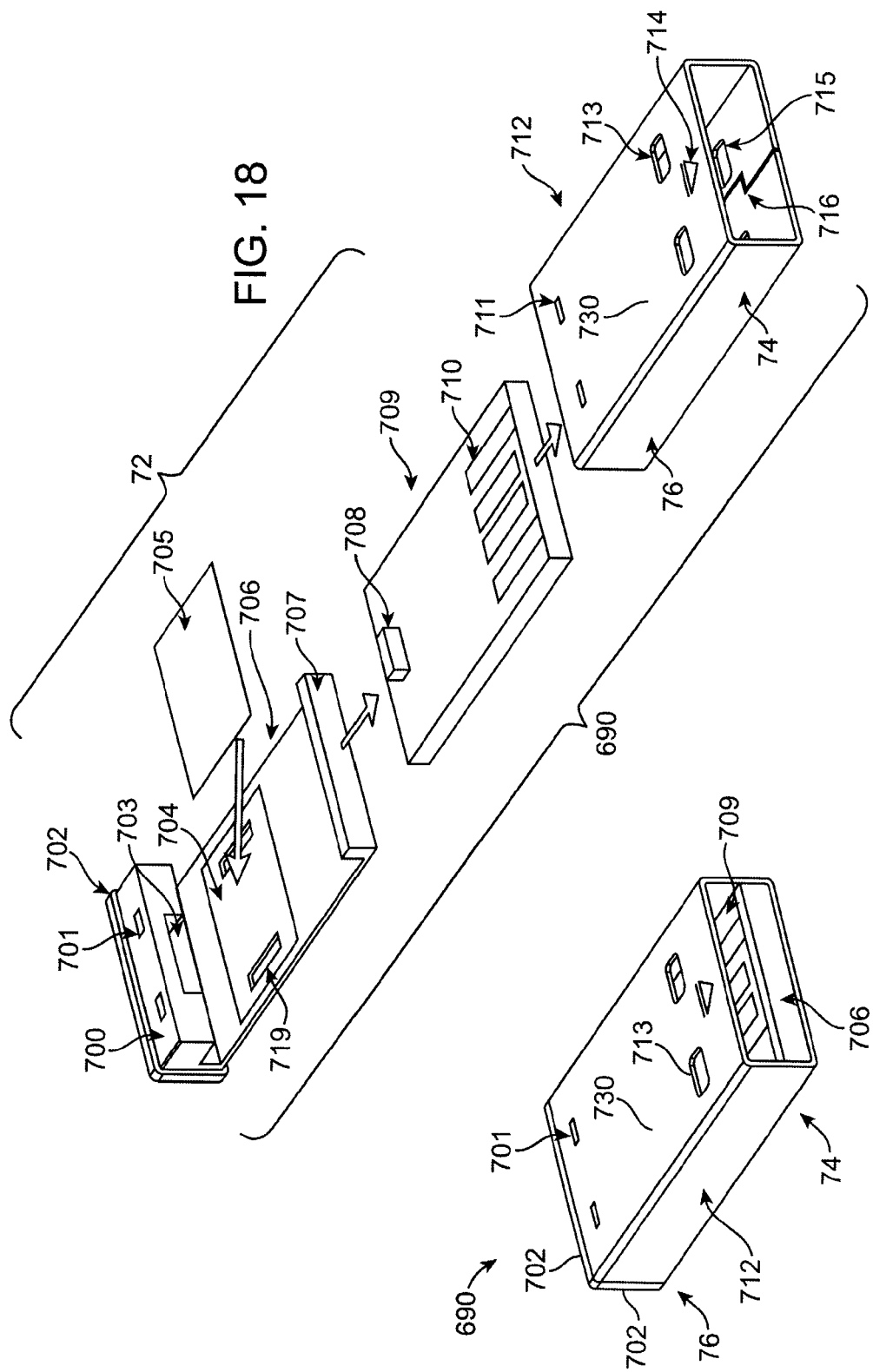

SINGLE CHIP UNIVERSAL SERIAL BUS (USB) PACKAGE WITH METAL HOUSING

CROSS REFERENCE TO RELATED APPLICATIONS

This application is a continuation-in-part of co-pending U.S. patent application Ser. No. 11/773,830, entitled "Molding Method to Manufacture Single-Chip Chip-On-Board USB Device", filed on Jul. 5, 2007, and is a continuation-in-part of co-pending U.S. patent application Ser. No. 11/309,847 entitled "USB Device with Integrated USB Plug with USB-substrate Supporter Inside" and filed on Oct. 12, 2006 and is a continuation-in-part of U.S. patent application Ser. No. 11/624,667, entitled "Electronic Data Storage Medium with Fingerprint Verification Capability", filed on Jan. 18, 2007 which is a divisional application of U.S. patent application Ser. No. 09/478,720, entitled "Electronic Data Storage Medium with Fingerprint Verification Capability" and filed on Jan. 6, 2000.

This application is related to U.S. Pat. No. 7,094,074, entitled "Manufacturing Methods for Ultra-Slim USB Flash-Memory Card with Supporting Dividers or Underside Ribs", filed on Oct. 28, 2004.

BACKGROUND OF THE INVENTION

1. Field of the Invention

The present invention relates generally to the field of universal serial bus (USB) memory cards (or devices) and particularly to USB memory cards including a USB device housing chip-on-board (COB) with a metal housing.

2. Description of the Prior Art

As computers have gained enormous popularity in recent decades, so has the need for better and more efficient ways of storing memory. Notable among memory devices are the portable ones that may be carried around by the user to access computers at different locations. This is particularly common in the case of personal computers (PC) where the need often arises to transfer data from one PC to another. Examples of portable memory devices include nonvolatile memory devices such as a universal serial bus (USB) flash drive that is removably connectable to a computer.

USB flash drives generally include a printed circuit board (PCB) or chip-on-board (COB) including memory or non-volatile memory and/or other electronic devices. Packaging of the COB is particularly vital because of the popularity the COB has enjoyed largely due to allowing packing in a small PCB area. USB drives are used extensively in consumer devices and as consumer gadgets are becoming slimmer and smaller in shape and size, there is a greater need for designing smaller and thinner footprint USB products to meet the requirements of the market trends.

The need therefore arises for a USB memory drive having a USB device having COB and packaged with metal housing.

SUMMARY OF THE INVENTION

Briefly, an embodiment of the present invention includes a Universal Serial Bus (USB) memory card includes a tube metal housing that is rectangular-shaped and a Chip-On-Board (COB)-Universal Serial Bus (USB) device and a carrier substrate having a U-block disposed on one side of thereof and vertically extending upwardly from a bottom surface of the U-block, the COB-USB device positioned on the carrier substrate forming a USB card sub-assembly, the USB card sub-assembly being securely located inside the metal housing with the U-block serving to stop the COB-USB device from slipping out of the metal housing.

The foregoing and other objects, features and advantages of the present invention will be apparent from the following detailed description of the preferred embodiments which make reference to several figures of the drawing.

IN THE DRAWINGS

FIG. 1 a top and side view of a universal serial bus (USB) flash drive USB memory card 10 is shown in accordance with an embodiment of the present invention.

Figure 5:
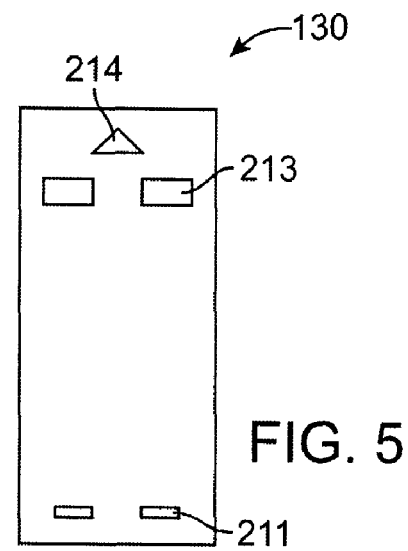

FIG. 5 shows a tube metal housing top surface 130 of the tube metal housing USB card sub-assembly 12 to further show the holes 213, the tube metal housing front portion 14 and the notches 211, in accordance with an embodiment of the present invention.

Figure 6:
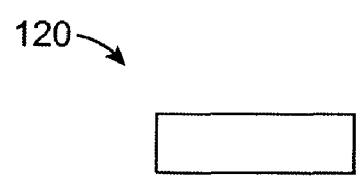

FIG. 6 shows a cross-sectional view of the tube metal housing 212.

Figure 7:
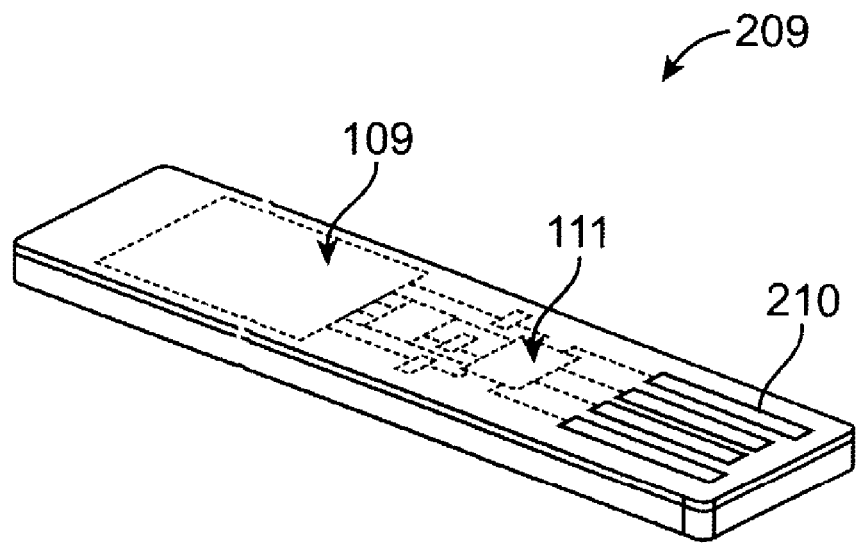

FIG. 7 shows further details of COB-USB device 209, in accordance with an embodiment of the present invention.

Figure 8:
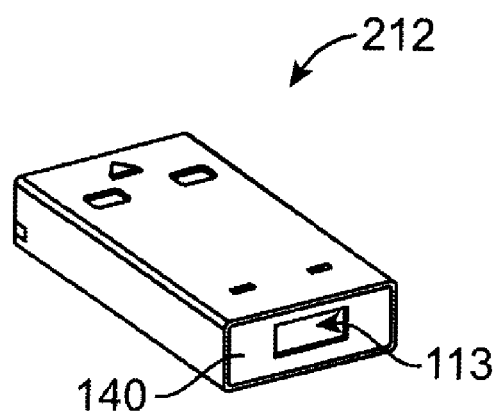

FIG. 8 shows further details of tube metal housing USB card sub-assembly 12, in accordance with an embodiment of the present invention.

Figure 9:
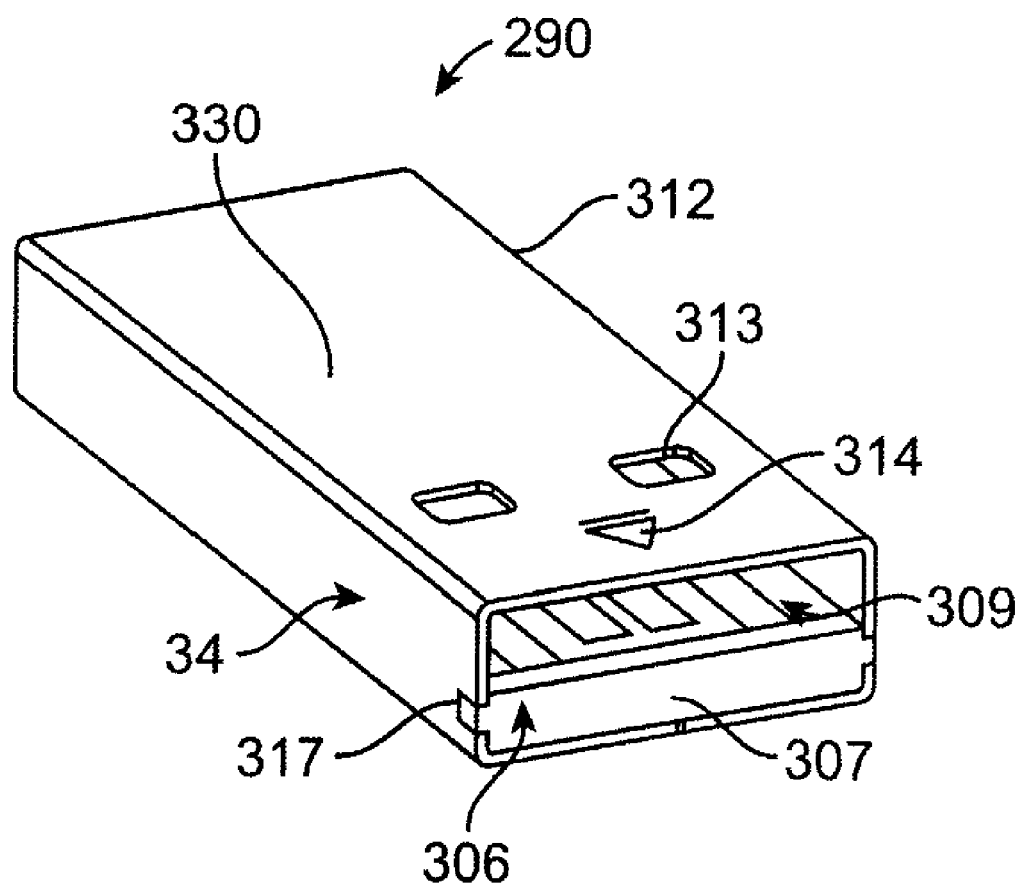

FIG. 9 shows a top and side view of a USB memory card 290, in accordance with another embodiment of the present invention.

Figure 10:
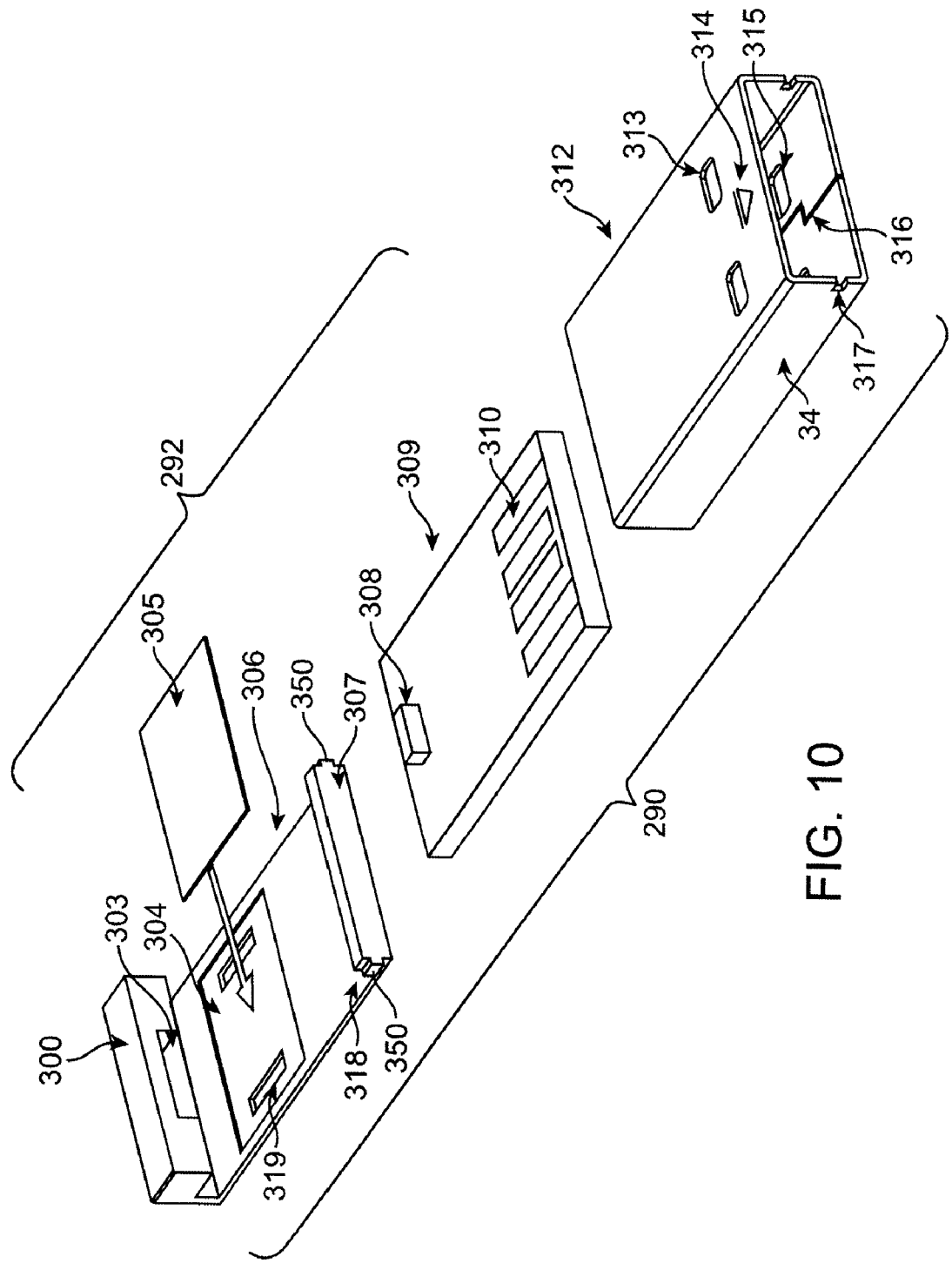

FIG. 10 shows further details of relevant components comprising the USB memory card 290.

FIG. 11 shows a top and side view of a USB memory card 390, in accordance with another embodiment of the present invention.

FIG. 12 shows further details of relevant components comprising the USB memory card 390.

FIG. 13 shows a top and side view of a USB memory card 490, in accordance with another embodiment of the present invention.

FIG. 14 shows further details of relevant components comprising the USB memory card 490.

FIG. 15 shows a top and side view of a USB memory card 590, in accordance with another embodiment of the present invention.

FIG. 16 shows further details of relevant components comprising the USB memory card 590.

FIG. 17 shows a top and side view of a USB memory card 690, in accordance with another embodiment of the present invention.

FIG. 18 shows further details of relevant components comprising the USB memory card 690.

DETAILED DESCRIPTION OF THE PREFERRED EMBODIMENTS

Figure 1:
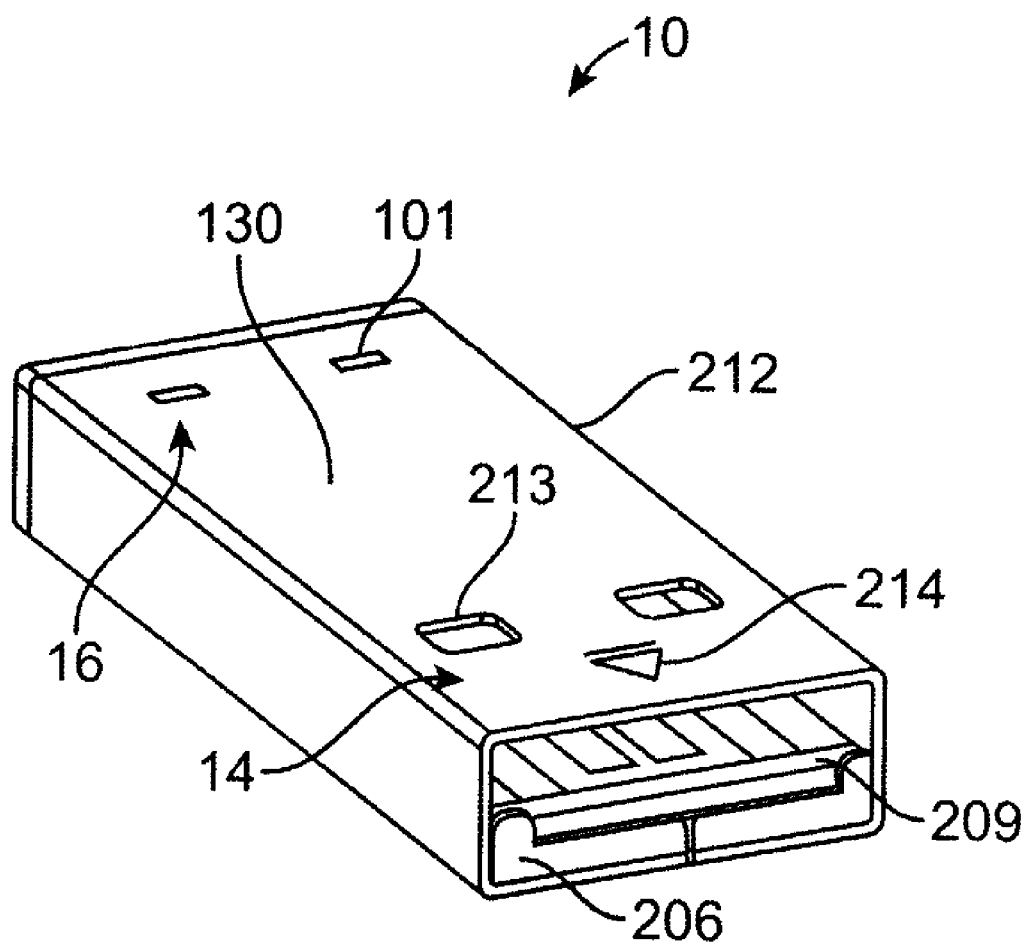

Referring now to FIG. 1, a top and side view of a universal serial bus (USB) flash drive USB memory card 10 is shown in accordance with an embodiment of the present invention. The USB memory card 10 is shown to include a tube metal housing 212, carrier substrate 206, and a COB-USB device 209. The COB-USB device 209 is shown substantially enclosed and therefore protracted by the tube metal housing USB card sub-assembly 12. The tube metal housing USB card sub-assembly 12 is generally rectangular and hollow in shape but may be other types of shapes in other embodiments. The tube metal housing USB card sub-assembly 12 is made of metal.

In an exemplary application, the USB memory card 10 is removably connectable to a host device, such as personal computer (PC) or an electronic consumer device for storing information in memory included in the COB-USB device 209. The USB memory card 10 is a compact device in large part due to the use of COB, which requires no leads or wires for connecting electrical components. The tube metal housing 212 serves to protect the COB-USB device 209 by encompassing the latter and is also metal. In a manner consistent with the foregoing, a user of the USB memory card 10 connects or plugs the USB memory card 10 into a host for operation thereof.

The tube metal housing 212 is shown to have a tube metal housing top surface 130 onto which are disposed two holes 213 at a tube metal housing front portion 14 and two holes disposed at a tube metal housing back portion 16. The holes 101 are generally punched through the top surface 130 of the tube metal housing 212. As will become apparent shortly, the holes 101 are each made of a recess into which a notch is positioned to secure the back end of the USB memory card 10. Two more holes 215 are disposed on the bottom surface of the tube metal housing 212 in a like position relative to the holes 213 (not shown in FIG. 1). At the tube metal housing front portion 14 is also shown depression mark 214 generally on the top surface 130 thereof, which is a directional pointer to guide users of the USB memory card 10 to insert the USB memory card 10 into a host in a direction consistent with the direction of the tube metal housing front portion 14.

Figure 2:
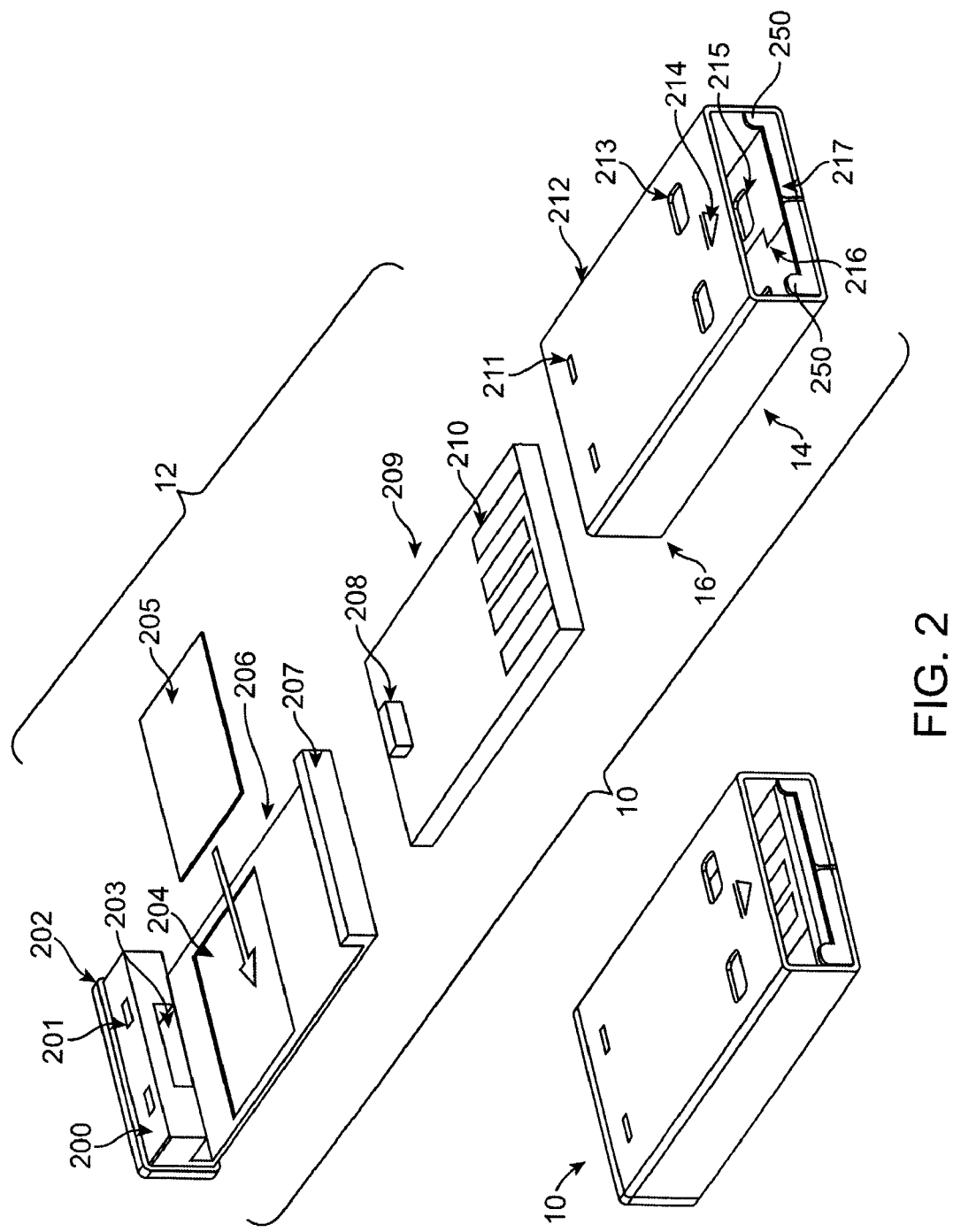
FIG. 2 shows further details of relevant components comprising the USB memory card 10.

FIG. 2 shows further details of relevant components comprising the USB memory card 10. The USB memory card 10 is shown to include a USB card sub-assembly 12 comprising the carrier substrate 206 and the COB-USB device 209. The carrier substrate is shown to include a U-block 200, a recesses (or depressions) 201, a protruded rim plate 202, a cavity hole 203, a rectangular depression 204, a thermo set adhesive tape 205 and a front block 207.

The COB-USB device 209 is shown to have disposed on top and back side thereof a LED 208 and on top and front side thereof contact fingers 210 for causing electrically contact to a host device when the USB memory card 10 is connected to the host.

The tube metal housing 212 of the USB card sub-assembly 12 is shown to include two notches 211s, two holes 213s and two holes 215s, the tube metal housing front portion 14, a tube metal housing back portion 16 and two folded-up gate plates 217s. The two notches 211 are disposed on either side of the top of the tube metal housing USB card sub-assembly 12 at its tube metal housing back portion 16 and the two holes 213 are disposed on either side of the top of the tube metal housing USB card sub-assembly 12 at its tube metal housing front portion 14, as is the tube metal housing front portion 14. The tube metal housing USB card sub-assembly 12 is generally a hollow rectangular cube. On the bottom surface of the tube metal housing USB card sub-assembly 12 is disposed the two holes 215 in like positions as their counterparts holes 213 and the tube metal housing back portion 16. The four holes 213 and 215 of the tube metal housing USB card sub-assembly 12 hold the USB memory card 10 in place when the USB memory card 10 is positioned in a host. The two folded-up gate plates 217s form a lip extending partially above the bottom surface of the tube metal housing USB card sub-assembly 12. Each of the folded-up gate plates 217s has a tab 250 extending upwardly from each side of the folded-up gate plates 217 to further prevent the USB card sub-assembly 12 from slipping out of the tube metal housing USB card sub-assembly 12. The front block 207 of the carrier substrate fits against each of the folded-up gate plates 217 of the tube metal housing USB card sub-assembly 12 when the USB card sub-assembly 12 is positioned into the tube metal housing USB card sub-assembly 12.

The two recesses 201 of the carrier substrate are dispersed onto the top of the U-block 200 at either side and serve to hold respective notches 211 of the tube metal housing USB card sub-assembly 12 in place to secure the USB card sub-assembly 12 within the tube metal housing USB card sub-assembly 12. The U-block 200 protrudes from a back side of the carrier substrate and extends partially above the bottom surface of the carrier substrate forming a U-shaped structure and has an indentation on a front surface thereof forming the cavity hole 203, which is a space into which the LED 208 is placed.

The carrier substrate is generally a single chip carrier substrate and in this connection, the COB-USB device 209 is a single chip COB-USB device although it is appreciated that other than a single-chip substrate and device may be employed.

The rectangular depression 204 is generally shallow to allow for lesser thermal tape requirements. The rectangular depression 204 houses the thermo set adhesive tape 205, which comes up to approximately 70-80% of the height of the rectangular depression 204. After the USB memory card 10 is assembled, it is heated to thermally seal the COB-USB device 209 to the carrier substrate. In one embodiment of the present invention, the carrier substrate is molded from thermo set plastic material The rectangular depression 204 is a thin, long rectangular floor having the length, width and height designed to accommodate the dimensions of the COB-USB device 209. The rectangular depression 204 is generally made to allow the thermo set adhesive tape 205 to place on and to sink in about 80% of the tape thickness. A front block 207 is designed to hold the front edge of the connector end of the COB-USB device 209.

The protruded rim plate 202 is generally a backend vertically-erected structure extending vertically upwards from the surface of the carrier substrate, which serves as a stopper to cap off the rear end of the tube metal housing USB card sub-assembly 12. The recesses 201 on the U-block 200 are designed to lock tight with the notches 211 near the rear end surface of the tube metal housing USB card sub-assembly 12. The U-block 200 is raised at a height equal to the thickness of the COB-USB device 209. The cavity hole 203 serves to house the LED 208. Corresponding to the cavity hole 203, there is a translucent window on the back surface of the protruded rim plate 202, shown in a subsequent figure, to allow the LED light to cast on it.

The COB-USB device 209 is assembled using the combination of surface mount technology (SMT) and COB assembly processes, which are well known to those of ordinary skill in the art. Details of fabricating this single chip COB-USB is described in CIP reference application U.S. Ser. No. 11/773, 830 filed Jul. 5, 2007 and entitled, "Molding Method to Manufacture Single-Chip Chip-On-Board USB Device". An LED 208 is surface-mounted on the back end of the COB-USB device 209.

The thermo set adhesive tape 205 is generally a thin film or thermal tape for adhering the COB-USB device 209 onto the rectangular depression 204 of the carrier substrate. The tube metal housing USB card sub-assembly 12 is generally a sheet metal folded and rectangular tube. This metal housing is made of steel material, in one embodiment of the present invention and can be plated with bright and shinny chromium or gold. The two notches 211s located near the tube metal housing back portion 16 of the tube metal housing USB card sub-assembly 12 serves to latch onto the two recesses 201s on the U-block 200. There are four holes 213 and holes 215, which in one embodiment of the present invention, are rectangular-shaped and at the front end are designed to lock in place with metal pins of a host when connected thereto. The tube metal housing front portion 14 is triangular in shape to point to a direction indicative of the direction in which the USB memory card 10 is inserted to connect the USB memory card 10 to a host and is thus a directional pointer to guide users. The tube metal housing back portion 16 is to interlock the sheet metal from which the tube metal housing USB card sub-assembly 12 is made so that it has a more sturdy structure. The two folded-up gate plates 217 are for stoppage and aesthetic purposes.

The thermo set adhesive tape 205 is typically double sided in that the thermo tape is on both sides of the thermo set adhesive tape 205 so as to cause the COB-USB device 209 to be taped securely to the carrier substrate.

To assembly USB memory card 10, first, the USB card sub-assembly 12 is formed with the thermo set adhesive tape 205 being taped onto the rectangular depression 204 of the carrier substrate. Then the COB-USB device 209 is slid carefully, without chipping of the LED 208, onto the carrier substrate to sit between the front block 207 and below the U-block 200 on top of the carrier substrate and then pressed down to stick on the adhesive tape of the thermo set adhesive tape 205. The USB card sub-assembly 12 is then slid into the rear end of the tube metal housing USB card sub-assembly 12, through the hollow front side of the tube metal housing USB card sub-assembly 12, and pushed to move up against the folded-up gate plates 217 of the tube metal housing USB card sub-assembly 12 so that the front block 207 sits against the folded-up gate plates 217 inside of the tube metal housing USB card sub-assembly 12.

The tube metal housing back portion 16 are square-wave like edges interlocking each other when the tube metal housing USB card sub-assembly 12 is formed of a sheet metal to form a hollow rectangular pipe of the sheet metal. The holes 215 are located in like location as that of the holes 213 on the bottom surface of the tube metal housing USB card sub-assembly 12.

Figure 3:
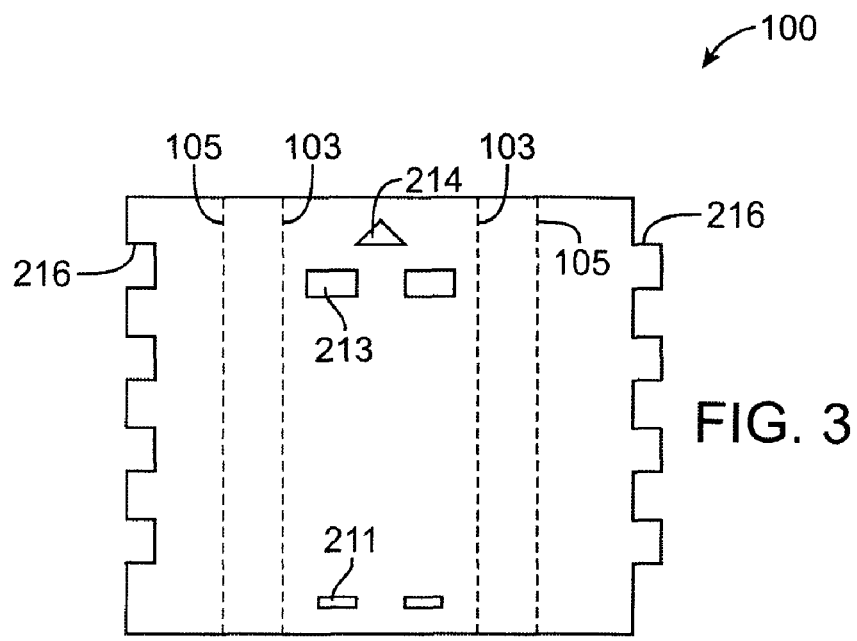
FIG. 3 shows a sheet metal 100 from which the tube metal housing 212 is made.

FIG. 3 shows a sheet metal 100 from which the tube metal housing 212 is made. The sheet metal 100 is shown to be made with edges and holes punched therethrough to form the holes 213, the notches 211 and the tube metal housing front portion 14. The sheet metal 100 is shown to have folding lines 103 with each line extending along a vertical direction of the length of the sheet metal 100 used for folding the sheet metal 100 along the folding lines 103 thereby bending the tube metal housing back portion 16 upwardly and out of the page.

The folding lines 105 also extend along a vertical direction of the length of the sheet metal 100 and are used to aid in further folding the sheet metal 100 after it has been folded along the folding lines 103 thereby folding the tube metal housing back portion 16 downwardly to fit the square-wave like edges of the tube metal housing back portion 16 within each other thereby forming the hollow rectangular pipe sectional outline of the tube metal housing USB card sub-assembly 12.

Figure 4:
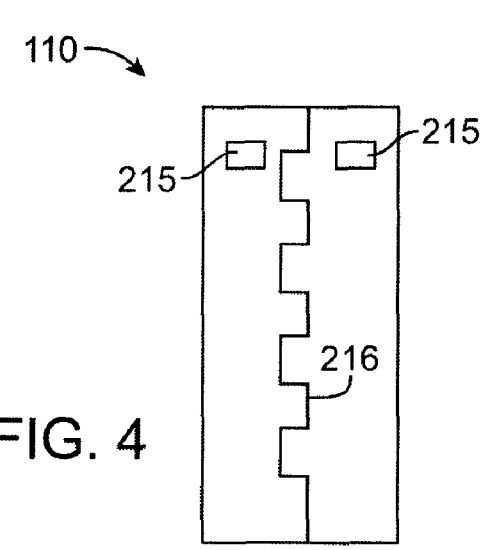
FIG. 4 shows the bottom side of the tube metal housing 212, which is shown to include the holes 215.

FIG. 4 shows the bottom side of the tube metal housing 212, which is shown to include the holes 215. FIG. 5 shows a tube metal housing top surface 130 of the tube metal housing USB card sub-assembly 12 to further show the holes 213, the tube metal housing front portion 14 and the notches 211, in accordance with an embodiment of the present invention.

FIG. 6 shows a side of the tube metal housing 212 where the COB-USB device 209 is not exposed.

FIG. 7 shows further details of COB-USB device 209, which is shown to include a flash memory die 109 and a controller die 111 and contact fingers 210. The flash memory die 109 and controller die 111 are each leadless or wireless die manufactured onto the COB-USB device 209. There is conductive material connecting the flash memory die 109 and controller die 111 together and the controller die 111 to a host through the contact fingers 210, which are shown disposed onto the surface of the flash memory die 109. The flash memory die 109 stores information, such as in the form of files, from a host to which the USB memory card 10 is coupled and the controller die 111 directs the flow of information between the host and the USB memory card 10.

FIG. 8 shows further details of tube metal housing USB card sub-assembly 12, in accordance with an embodiment of the present invention. In particular, the tube metal housing USB card sub-assembly 12 is shown to include a LED window 113 disposed substantially in the middle of a side tube metal housing back portion 140 of the tube metal housing USB card sub-assembly 12 that is not hollow and does not expose the COB-USB device 209. The side of the tube metal housing USB card sub-assembly 12 exposing the COB-USB device 209 is shown in FIG. 1 and it is the back of the U-block 200. The LED 208 slides through the cavity hole 203 to line up with the LED window 113. The LED window 113 serves as an LED window to allow emitting light from the LED to travel through the inside of the USB memory card 10 when the COB-USB device 209 is enclosed by the tube metal housing USB card sub-assembly 12. The LED window 113 is made of transparent plastic material that allows LED light to pass through. The LED 208 is also coupled to some of the electrical components of the COB-USB device 209, such as the controller die. In operation, when the USB memory card 10 is coupled to the host, the light that is shone through the LED window 113 by the LED 208 indicates that the USB memory card 10 is active or operational and when not lit, there is an indication that the USB memory card 10 is not active or inoperational.

FIG. 9 shows a top and side view of a USB memory card 290, in accordance with another embodiment of the present invention. The USB memory card 290 is shown to include a tube metal housing 312, carrier substrate 306, and a COB-USB device 309. The COB-USB device 309 is shown substantially enclosed and therefore protracted by the metal housing 312 but exposed at the front side of the metal housing 312 where the metal housing 312 is shown open. The metal housing 312 is generally rectangular and hollow in shape but may be other types of shapes in other embodiments. The metal housing 312 is made of metal.

In an exemplary application, the USB memory card 290 is removably connectable to a host device, such as PC or an electronic consumer device for storing information in memory included in the COB-USB device 309.

The carrier substrate 306 is shown to have a front block 307 that is a partially raised portion of the carrier substrate 306 serving as stoppage for the COB-USB device 309 disallowing the latter from slipping out of the metal housing 312.

The USB memory card 290 is a compact device in large part due to the use of COB, which requires no leads or wires for connecting electrical components. Metal housing 312 serves to protect the COB-USB device 309. In a manner consistent with the foregoing, a user of the USB memory card 290 connects or plugs the USB memory card 290 into a host for operation thereof.

The COB-USB device 309 is analogous to the COB-USB device 209. The COB-USB device 309, after it has been placed onto a substrate, is inserted into the holes 313 from the front side of the holes 313 and pushed therein until the front block 307 lines up with the cut holes 317 of the metal housing 312. Upon such insertion, the assembly is heated to a temperature that cures a thermal tape securing the COB-USB device 309 onto its substrate.

The metal housing 312 is shown to have a metal case top surface 330 onto which are disposed two holes 313 at a tube metal housing front portion 34 of thereof. Two more holes 313, or holes 315, are disposed on the bottom surface of the metal housing 312, not shown in FIG. 9. At the tube metal housing front portion 34 of the metal housing 312 is also shown disposed a depression mark 314, which is a directional pointer to guide users of the USB memory card 290 to insert the USB memory card 290 into a host in a direction consistent with the direction of the depression mark 314.

FIG. 10 shows further details of relevant components comprising the USB memory card 290. The USB memory card 290 is shown to include a USB card sub-assembly 292 comprising the carrier substrate 306 and the COB-USB device 309. The carrier substrate 306 is shown to include a U-block 300, a cavity hole 303, a rectangular depression 304, a thermo set adhesive tape 305, a front rectangular block 318 and a front block 307.

The COB-USB device 309 is shown to have disposed on top and back side thereof a LED 308 and on top and front side thereof contact fingers 310 for causing electrically contact to a host device when the USB memory card 290 is connected to the host.

The metal housing 312 is shown to include two holes 313 and two holes 315, the depression mark 314, a square-wave edge 316 and two cut holes 317. The two holes 313 are disposed on either side of the top of the metal housing 312 at its tube metal housing front portion 34, as is the depression mark 314. The metal housing 312 is generally a hollow rectangular cube. On the bottom surface of the metal housing 312 is disposed the two holes 315, each located in like position relative to its respective one of the holes 313. The four holes 313 and holes 315 of the metal housing 312 hold the USB memory card 290 in place when the USB memory card 290 is positioned in a host.

The two cut holes 317 are formed on either side of the metal housing 312 and substantially in the middle thereof. The cut holes 317 each hold corresponding horns 350 of the carrier substrate 306 when the USB card sub-assembly 292 is inserted into the tube metal housing 312. The sub-assembly 292 is comprised of the carrier substrate 306 and the COB-USB device 309. The front block 307 of the carrier substrate 306 fits into the hollow front side of the metal housing 312 with the horns 350 lining up with their corresponding cut holes 317 of the metal housing 312 when the USB card sub-assembly 292 is positioned into the metal housing 312.

The U-block 300 protrudes from a back side of the carrier substrate 306 and extends partially above the bottom surface of the carrier substrate 306 forming a U-shaped structure and has an indentation on a front surface thereof forming the cavity hole 303, which is a space into which the LED 308 is placed.

The carrier substrate 306 is generally a single chip carrier substrate and in this connection, the COB-USB device 309 is a single chip COB-USB device although it is appreciated that other than a single-chip substrate and device may be employed.

The rectangular depression 304 is generally shallow to allow for lesser thermal tape requirements. The rectangular depression 304 includes two hole slots 319 that are each generally long rectangular in shape and intentionally made to allow the thermo set adhesive tape to melt and to flow down to the metal housing 312's bottom inner surface to make better adhesive bonding with the metal housing 312 during the thermal cure cycle.

The rectangular depression 304 houses the thermo set adhesive tape 305, which comes up to approximately 70-80% of the height of the rectangular depression 204. After the USB memory card 290 is assembled, it is heated to thermally seal the COB-USB device 309 to the carrier substrate 306. In one embodiment of the present invention, the carrier substrate is molded from thermo set plastic material. The rectangular depression 304 is generally a thin, long rectangular floor having the length, width and height designed to accommodate the dimensions of the COB-USB device 309. The rectangular depression 304 is generally made to allow the thermo set adhesive tape 305 to place on and to sink in about 80% of the tape thickness. A front block 307 is designed to hold the front edge of the connector end of the COB-USB device 309.

The front rectangular block 318 has two horns 350s, each located on a side of the front rectangular block 318. The front rectangular block 318 with its horns 350 is designed to be held at the front edge of the connector end of the COB-USB device 309 as well as latch onto the cut holes 317 at both sides of the front of the metal housing 312.

The U-block 300 is raised at a height equal to the thickness of the COB-USB device 309. The cavity hole 303 serves to house the LED 308. As in the embodiment of FIG. 8, there is a translucent window on the back surface of the U-block 300 to allow the LED light to cast on it.

The COB-USB device 309 is assembled using the combination of SMT and COB assembly processes, similar to that of the COB-USB device 309.

The thermo set adhesive tape 305 is made for adhering the COB-USB device 309 onto the rectangular depression 304 of the carrier substrate 306. The metal housing 312 is metal and in an exemplary embodiment, made of steel material and can be plated with bright and shinny chromium or gold. The holes 313 and 315 are designed to lock in place with the metal pins in the host when the USB memory card 290 is connected to the host. The depression mark 314 is a directional pointer to guide users for drive-to-host insertion. The square-wave edge 316 serves to interlock the sheet metal from which the holes 313 are made so that it has a more sturdy structure. The cut holes 317s are designed to hold the front rectangular block 318 so that the whole carrier substrate sub-assembly will be hold tight inside the metal housing.

The assembly of the USB card sub-assembly 292 is similar to that of the assembly of the USB memory card 10. The thermo set adhesive tape 305 is taped onto the rectangular depression 304 of the carrier substrate 306. Then the COB-USB device 309 is carefully slid, without chipping of the LED 308, into the carrier substrate 306 and then pressed down to stick on the adhesive tape to form the USB card sub-assembly 292. The USB card sub-assembly 292 is then slid into the back end of the metal housing 312 from the hollow front side of the metal housing 312. The USB memory card 290 is then pass through a temperature curing oven to cure the thermo set adhesive tape 305, which secures the COB-USB device 309 into the holes 313.

Further details of the USB memory card 290 are similar to those shown in FIGS. 3-8 for the USB memory card 10 and are therefore not repeated in the interest of preventing redundancy.

FIG. 11 shows a top and side view of a USB memory card 390, in accordance with another embodiment of the present invention. The USB memory card 390 is shown to include a tube metal housing 412, carrier substrate 406, and a COB-USB device 409. The COB-USB device 409 is shown substantially enclosed and therefore protracted by the tube metal housing 412 but exposed at the front side of the tube metal housing 412 where the tube metal housing 412 is shown open. The tube metal housing 412 is generally rectangular and hollow in shape but may be other types of shapes in other embodiments. In one embodiment of the present invention, the tube metal housing 412 is made of metal.

In an exemplary application, the USB memory card 390 is removably connectable to a host device, such as PC or an electronic consumer device for storing information in memory included in the COB-USB device 409. The COB-USB device 409 and the carrier substrate 406 collectively comprise the metal housing 412.

The USB memory card 390 is a compact device in large part due to the use of COB, which requires no leads or wires for connecting electrical components. The metal housing 412 serves to protect the COB-USB device 309 much in the same way as discussed relative to the USB memory card 10. In a manner consistent with the foregoing, a user of the USB memory card 390 connects or plugs into a host for operation thereof.

The COB-USB device 409 is analogous to the COB-USB device 209 and the COB-USB device 309. The COB-USB device 409, after is it has been placed onto a substrate, is inserted into the holes 413 from the front side of the holes 413 and pushed therein until the front block 407 lines up with the cut holes 417 of the metal housing 412. Upon such insertion, the assembly is heated to a temperature that cures a thermal tape securing the COB-USB device 409 onto its substrate.

The metal housing 412 is shown to have a top surface 430 onto which are disposed two holes 413 at a tube metal housing front portion 44 of the metal housing 412 and two recesses (or depressions) 401 disposed at a tube metal housing back portion 46 of the metal housing 412. As will become apparent shortly, the recesses (or depressions) 401 are each made of a recess into which a notch is positioned to secure the back end of the USB memory card 390. Two more holes 413, or holes 415 are disposed on the bottom surface of the metal housing 412, not shown in FIG. 11. At the tube metal housing front portion 44 of the metal housing 412 is also shown disposed a depression mark 414, which is a directional pointer to guide users of the USB memory card 390 to insert the USB memory card 390 into a host in a direction consistent with the direction of the depression mark 414.

FIG. 12 shows further details of relevant components comprising the USB memory card 390. The USB memory card 390 is shown to include a USB card sub-assembly 42 comprising the carrier substrate 406 and the COB-USB device 409. The carrier substrate 406 is shown to include a U-block 400, a recesses (or depressions) 401, a protruded rim plate 402, a cavity hole 403, a rectangular depression 404, a thermo set adhesive tape 405 and a front block 407.

The COB-USB device 409 is similar to and functions in the same manner as the COB-USB device 309 and the COB-USB device 209.

The metal housing 412 is shown to include two notches 411s, two holes 413s and two holes 415s, the depression mark 414, and square-wave edge 416, The two notches 411s are disposed on either side of the top of the metal housing 412 at its tube metal housing back portion 46 and the two holes 413s are disposed on either side of the top of the metal housing 412 at its tube metal housing front portion 44, as is the tube metal housing front portion 414. The metal housing 412 is generally a hollow rectangular cube. On the bottom surface of the metal housing 412 is disposed the two holes 415s in like positions as their counterparts holes 413 and the tube metal housing back portion 416. The four holes 413 and holes 415s of the metal housing 412 hold the USB memory card 390 in place when the USB memory card 390 is positioned in a host.

The two recesses (or depressions) 401s of the carrier substrate 406 are dispersed onto the top of the U-block 400 at either side and serve to hold respective notches 411 of the metal housing 412 in place to secure the USB card sub-assembly 42 within the metal housing 412. The U-block 400 protrudes from a back side of the carrier substrate 406 and extends partially above the bottom surface of the carrier substrate 406 forming a U-shaped structure and has an indentation on a front surface thereof forming the cavity hole 403, which is a space into which the LED 408 is placed.

The carrier substrate 406 is generally a single chip carrier substrate and in this connection, the COB-USB device 409 is a single chip COB-USB device although it is appreciated that other than a single-chip substrate and device may be employed.

The rectangular depression 404 is generally shallow to allow for lesser thermal tape requirements. The rectangular depression 404 houses the thermo set adhesive tape 405, which comes up to approximately 70-80% of the height of the rectangular depression 404. After the USB memory card 390 is assembled, it is heated to thermally seal the COB-USB device 409 to the carrier substrate 406.

In one embodiment of the present invention, the carrier substrate 406 is molded from thermo set plastic material The rectangular depression 404 is a thin, long rectangular floor having the length, width and height designed to accommodate the dimensions of the COB-USB device 409. The rectangular depression 404 is generally made to allow the thermo set adhesive tape 405 to place on and to sink in approximately 70-80% of the tape thickness. A front block 407 is designed to hold the front edge of the connector end of the COB-USB device 409.

The protruded rim plate 402 is generally a backend vertically-erected structure, which serves as a stopper to cap off the rear end of the metal housing 412. The recesses (or depressions) 401 on the U-block 400 are designed to lock tight with the notches 411 near the rear end surface of the metal housing 412. The U-block 400 is raised at a height equal to the thickness of the COB-USB device 409. The cavity hole 403 serves to house the LED 408. Corresponding to the cavity hole 403, there is a translucent window on the back surface of the protruded rim plate 402, shown in a subsequent figure, to allow the LED light to cast on it.

The COB-USB device 409 is assembled using the combination of SMT and COB assembly processes, which are well known to those of ordinary skill in the art. Details of fabricating this single chip COB-USB is described in CIP reference application U.S. Ser. No. 11/773,830 filed Jul. 5, 2007 titled, "Molding Method to Manufacture Single-Chip Chip-On-Board USB Device". An LED 208 is surface-mounted on the back end of the COB-USB device 209.

The thermo set adhesive tape 405 is generally a thin film or thermal tape suited for adhering the COB-USB device 409 onto the rectangular depression 404 of the carrier substrate 406. The metal housing 412 is generally a sheet metal folded and rectangular tube. This metal housing is made of steel material, in one embodiment of the present invention and can be plated with bright and shinny chromium or gold. The two notches 411s located near the tube metal housing back portion 46 of the metal housing 412 serves to latch onto the two recesses (or depressions) 401s on the U-block 400. There are four holes 413 and holes 415, which in one embodiment of the present invention, are rectangular-shaped and at the front end are designed to lock in place with metal pins of a host when connected thereto. The tube metal housing front portion 414 is triangular in shape to point to a direction indicative of the direction in which the USB memory card 390 is inserted to connect the USB memory card 390 to a host and is thus a directional pointer to guide users. The tube metal housing back portion 416 is to interlock the sheet metal from which the USB card sub-assembly 412 is made so that it has a more sturdy structure.

The thermo set adhesive tape 405 is typically double sided in that the thermo tape is on both sides of the thermo set adhesive tape 405 so as to cause the COB-USB device 409 to be taped securely to the carrier substrate 406.

To assembly USB memory card 390, first, the USB card sub-assembly 42 is formed with the thermo set adhesive tape 405 being taped onto the rectangular depression 404 of the carrier substrate 406. Then the COB-USB device 409 is slid carefully, without chipping of the LED 408, onto the carrier substrate 406 to position between the front block 407 and below the U-block 400 on top of the carrier substrate 406 and then pressed down to stick on the adhesive tape of the thermo set adhesive tape 405. The USB card sub-assembly 42 is then slid into the rear end of the metal housing 412, through the hollow front side of the metal housing 412, and pushed to move up against the cut holes 417 of the metal housing 412 so that the front block 407 sits against the cut holes 417 inside of the metal housing 412.

The tube metal housing back portion 416 are square-wave like edges interlocking each other when the metal housing 412 is formed of a sheet metal to form a hollow rectangular pipe of the sheet metal. The holes 415 are located in like location as that of the holes 413 on the bottom surface of the metal housing 412 much in the same manner as discussed relative to the holes 215 and holes 213 of FIG. 2.

To summarize, the carrier substrate 406 is molded from thermo set plastic materials and consists of a thin, long rectangular floor having the length, width and height that designed to accommodate the dimensions of the COB-USB device 409. The rectangular depression 404 is made to allow the thermo set adhesive tape 405 to place on and to sink in approximately 70-80% of the tape thickness. The protruded rim plate 402 serves as a stopper to cap off the back end of the metal housing 412. The two recesses (or depressions) 401s on the U-block 400 are designed to lock tight with the notches 411 near the rear end surface of the metal housing 412. The U-block 400 is raised at a height equal to the thickness of the COB-USB device 409. The cavity hole 403 is served to house the LED 408. Corresponding to this cavity hole, there is a translucent window on the back surface of the protruded rim plate 402 to allow the LED light to cast on it. The thermo set adhesive tape 405 causes the COB-USB device 409 to adhere onto the rectangular depression 404 of the carrier substrate 406. The metal housing 412 is made of steel material and can be plated with bright and shinny chromium or gold. The holes 413 and holes 415 at the front end are designed to lock in place with the metal pins in the host system when connected. The depression mark 414 is a directional pointer to guide users for device to host insertion. The tube metal housing back portion 416 is to interlock the sheet metal so that it has a more sturdy structure.

The assembly of the USB memory card 390 involves taping the thermo set adhesive tape 405 onto the rectangular depression 404 of the carrier substrate 406. Then, the COB-USB device 409 is slid carefully, without chipping of the LED 408, into the carrier substrate 406 and then press down to stick on the adhesive tape to form the USB card sub-assembly 42. The USB card sub-assembly 12 is then slid into the rear end of the 4USB card sub-assembly 12, through the hollow front side thereof. The completed USB memory card then passes through a temperature curing oven to cure the thermo set adhesive tape 405.

Further details of the USB memory card 390 are similar to those shown in FIGS. 3-8 for the USB memory card 10 and thus the reader is referred to these figures and corresponding discussion herein.

FIG. 13 shows a top and side view of a USB memory card 490, in accordance with another embodiment of the present invention. The USB memory card 490 is shown to include a metal housing 512, carrier substrate 506, and a COB-USB device 509. The COB-USB device 509 is shown substantially enclosed and therefore protracted by the metal housing 512 but exposed at the front side of the metal housing 512 where the metal housing 512 is shown open. The metal housing 512 is generally rectangular and hollow in shape but may be other types of shapes in other embodiments. The metal housing 512 is made of metal.

In an exemplary application, the USB memory card 490 is removably connectable to a host device, such as PC or an electronic consumer device for storing information in memory included in the COB-USB device 509.

The carrier substrate 506 is shown to have a front block 507 that is a partially raised portion of the carrier substrate 506 serving as stoppage for the COB-USB device 509 disallowing the latter from slipping out of the metal housing 512.

The USB memory card 490 is a compact device in large part due to the use of COB, which requires no leads or wires for connecting electrical components. metal housing 512 serves to protect the COB-USB device 509. In a manner consistent with the foregoing, a user of the USB memory card 490 connects or plugs the USB memory card 490 into a host for operation thereof. The COB-USB device 509 is analogous to the COB-USB device 209. The COB-USB device 509 after is it has been placed onto a substrate is inserted into the holes 513 from the front side of the holes 513 and pushed therein until the front block 507 lines up with the cut holes 517 of the metal housing 512. Upon such insertion, the assembly is heated to a temperature that cures a thermal tape securing the COB-USB device 509 onto its substrate.

The metal housing 512 is shown to have a tube metal housing top surface 530 onto which are disposed two holes 513 at a tube metal housing front portion 54 of the metal housing 512. Two more holes 513, or holes 515, are disposed on the bottom surface of the metal housing 512, not shown in FIG. 13. At the tube metal housing front portion 54 of the metal housing 512 is also shown disposed a tube metal housing front portion 514, which is merely a directional pointer to guide users of the USB memory card 490 to insert the USB memory card 490 into a host in a direction consistent with the direction of the 5tube metal housing front portion 14.

The carrier substrate 506 is shown to have a front block 507 that is a partially raised portion of the carrier substrate 506 serving as stoppage for the COB-USB device 509 disallowing the latter from slipping out of the metal housing 512.

The metal housing 512 is shown to have a tube metal housing top surface 530 onto which are disposed two holes 513 at a tube metal housing front portion 54 of the metal housing 512 and two recesses 501 disposed at a tube metal housing back portion 56 of the metal housing 512. As will become apparent shortly, the recesses 501 are each made of a recess into which a notch is positioned to secure the back end of the USB memory card 490. Two more holes 513, or holes 515 are disposed on the bottom surface of the metal housing 512, not shown in FIG. 13. At the tube metal housing front portion 54 of the metal housing 512 is also shown disposed a tube metal housing front portion 514, which is merely a directional pointer to guide users of the USB memory card 490 to insert the USB memory card 490 into a host in a direction consistent with the direction of the depression mark 514.

FIG. 14 shows further details of relevant components comprising the USB memory card 490. The USB memory card 490 is shown to include a USB card sub-assembly 52 comprising the carrier substrate 506 and the COB-USB device 509. The carrier substrate 506 is shown to include a U-block 500, a recesses 501, a protruded rim plate 502, a cavity hole 503, a rectangular depression 504, a thermo set adhesive tape 505, a front rectangular block 518, a thermo set adhesive tape 505 and a front block 507. The front block 507 has two horns 550s extending out from each of its sides. The horns 550s fit into respective cut holes 517s of the metal housing 512.

The COB-USB device 509 is similar to and functions in the same manner as the COB-USB device 409, COB-USB device 309 and the COB-USB device 209.

The metal housing 512 is shown to include two notches 511, two holes 513 and two holes 515, the tube metal housing front portion 514, a tube metal housing back portion 516 and two cut holes 517. The two notches 511 are disposed on either side of the top of the metal housing 512 at its tube metal housing back portion 56 and the two holes 513 are disposed on either side of the top of the metal housing 512 at its tube metal housing front portion 54, as is the 5tube metal housing front portion 14. The metal housing 512 is generally a hollow rectangular cube. On the bottom surface of the metal housing 512 is disposed the two holes 515 in like positions as their counterparts holes 513 and the 5tube metal housing back portion 16. The four holes 513 and holes 515 of the metal housing 512 hold the USB memory card 490 in place when the USB memory card 490 is positioned in a host.

The two recesses 501s of the carrier substrate 506 are dispersed onto the top of the U-block 500 at either side and serve to hold respective notches 511 of the metal housing 512 in place to secure the USB card sub-assembly 52 within the metal housing 512. The U-block 500 protrudes from a back side of the carrier substrate 506 and extends partially above the bottom surface of the carrier substrate 506 forming a U-shaped structure and has an indentation on a front surface thereof forming the cavity hole 503, which is a space into which the LED 508 is placed.

The carrier substrate 506 is shown to have a front block 507 that is a partially raised portion of the carrier substrate 506 serving as stoppage for the COB-USB device 509 disallowing the latter from slipping out of the metal housing 512.

The carrier substrate 506 is generally a single chip carrier substrate and in this connection, the COB-USB device 509 is a single chip COB-USB device although it is appreciated that other than a single-chip substrate and device may be employed.

The rectangular depression 504 is generally shallow to allow for lesser thermal tape requirements. The rectangular depression 504 houses the thermo set adhesive tape 505, which comes up to approximately 70-80% of the height of the rectangular depression 504. After the USB memory card 490 is assembled, it is heated to thermally seal the COB-USB device 509 to the carrier substrate 506. In one embodiment of the present invention, the carrier substrate 506 is molded from thermo set plastic material The rectangular depression 504 is a thin, long rectangular floor having the length, width and height designed to accommodate the dimensions of the COB-USB device 509. The rectangular depression 504 is generally made to allow the thermo set adhesive tape 505 to place on and to sink in about 80% of the tape thickness. A front block 507 is designed to hold the front edge of the connector end of the COB-USB device 509.

The protruded rim plate 502 is generally a backend vertically-erected structure, which serves as a stopper to cap off the rear end of the metal housing 512. The recesses 501 on the U-block 500 are designed to lock tight with the notches 511 near the rear end surface of the metal housing 512. The U-block 500 is raised at a height equal to the thickness of the COB-USB device 509. The cavity hole 503 serves to house the LED LED 508. Corresponding to the cavity hole 503, there is a translucent window on the back surface of the protruded rim plate 502, shown in a subsequent figure, to allow the LED light to cast on it.

The COB-USB device 509 is assembled using the combination of SMT and COB assembly processes, which are well known to those of ordinary skill in the art. Details of fabricating this single chip COB-USB is described in CIP reference application U.S. Ser. No. 11/773,830 filed Jul. 5, 2007 titled, "Molding Method to Manufacture Single-Chip Chip-On-Board USB Device".

An LED 508 is surface-mounted on the back end of the COB-USB device 509.

The thermo set adhesive tape 505 is generally a thin film or thermal tape for adhering the COB-USB device 509 onto the rectangular depression 504 of the carrier substrate 506. The metal housing 512 is generally a sheet metal folded and rectangular tube. This metal housing is made of steel material, in one embodiment of the present invention and can be plated with bright and shinny chromium or gold. The two notches 511s located near the tube metal housing back portion 56 of the metal housing 512 serves to latch onto the two recesses 501 on the U-block 500. There are four holes 513 and 515, which in one embodiment of the present invention, are rectangular-shaped and at the front end are designed to lock in place with metal pins of a host when connected thereto. The depression mark 514 is triangular in shape to point to a direction indicative of the direction in which the USB memory card 590 is inserted to connect the USB memory card 590 to a host and is thus a directional pointer to guide users. The tube metal housing back portion 516 is to interlock the sheet metal from which the metal housing 512 is made so that it has a more sturdy structure. The two cut holes 517 are for stoppage and aesthetic purposes.

The thermo set adhesive tape 505 is typically double sided in that the thermo tape is on both sides of the thermo set adhesive tape 505 so as to cause the COB-USB device 509 to be taped securely to the carrier substrate 506.

The COB-USB device 509, after it has been placed onto a substrate, is inserted into the holes 513 from the front side of the holes 513 and pushed therein until the front block 507 lines up with the cut holes 517 of the metal housing 512. Upon such insertion, the assembly is heated to a temperature that cures a thermal tape securing the COB-USB device 509 onto its substrate.

The two cut holes 517 are formed on either side of the metal housing 512 and substantially in the middle thereof. The cut holes 517 each hold corresponding horns 550 of the carrier substrate 506 when the USB card sub-assembly 52 is inserted into the metal housing 512. The front block 507 of the carrier substrate 506 fits into the hollow front side of the metal housing 512 with the horns 550 lining up with their corresponding cut holes 517 of the metal housing 512 when the USB card sub-assembly 52 is positioned into the metal housing 512. The front rectangular block 518 with its horns 550s is designed to be held at the front edge of the connector end of the COB-USB device 509 as well as latch onto the cut holes 517 at both sides of the front metal housing.

To assemble USB memory card 490, first, the USB card sub-assembly 52 is formed with the thermo set adhesive tape 505 being taped onto the rectangular depression 504 of the carrier substrate 506. Then the COB-USB device 509 is slid carefully, without chipping of the LED 508, onto the carrier substrate 506 to sit between the front block 507 and below the U-block 500 on top of the carrier substrate 506 and then pressed down to stick on the adhesive tape of the thermo set adhesive tape 505. The USB card sub-assembly 52 is then slid into the rear end of the metal housing 512, through the hollow front side of the metal housing 512, and pushed to move up against the cut holes 517 of the metal housing 512 so that the front block 507 sits against the cut holes 517 inside of the metal housing 512.

The tube metal housing back portion 516 are square-wave like edges interlocking each other when the metal housing 12 is formed of a sheet metal to form a hollow rectangular pipe of the sheet metal. The holes 515 are located in like location as that of the holes 513 on the bottom surface of the metal housing 512 much in the same manner as discussed relative to the holes 215 and holes 213 of FIG. 2.

To summarize, the carrier substrate 506 is molded from thermo set plastic materials and consists of a thin, long rectangular floor has the length, width and height that designed to accommodate the dimensions of the COB-USB device 509. The rectangular depression 504 is made to allow the thermo set adhesive tape 505 to place on and to sink in approximately 70-80% of the tape thickness. The front rectangular block 518 with tabs 580 at both ends is designed to be held at the front edge of the connector end of the COB-USB device 509 as well as latch onto the cut holes 517 at both sides of the front metal housing.

A backend vertically erected structure consists of the U-block 500 which is raised at a height equal to the thickness of the COB-USB device 509. Two recesses 501 on the U-block 500 are designed to lock tight with the notches 511 near the rear end surface of the metal housing 512. The cavity hole 503 serves to house the LED 508. Corresponding to this cavity hole, there is a translucent window on the back surface of the U-block 500 to allow the LED light to cast on it.

The thermo set adhesive tape 505 causes adhering of the COB-USB device 509 onto the rectangular depression 504 of the carrier substrate 506. The metal housing 512 is made of steel material and can be plated with bright and shinny chromium or gold. There are four holes 513 and holes 515 at the front end are designed to lock in place with the metal pins in the host system when connected. The triangular-shaped tube metal housing front portion 514 is a directional pointer to guide users for device to host insertion. The tube metal housing back portion 516 interlocks the sheet metal so that it has a more sturdy structure. The cut holes 517 are designed to hold the front rectangular block 518 so that the whole carrier substrate sub-assembly will be hold tight inside the metal housing.

The assembly of the USB memory card 490 is to first tape the thermo set adhesive tape 505 onto the rectangular depression 504 of the carrier substrate 506. Then the COB-USB device 509 is slid, without chipping of the LED 508, into the carrier substrate 506 and then pressed down to stick on the adhesive tape forming the USB card sub-assembly 52. The USB card sub-assembly 52 is then slid into the back end of the metal housing 512 through the hollow front side of the metal housing 512. The completed USB memory card then pass through a temperature curing oven to cure the thermo set adhesive tape 505 to form the USB memory card 490.

FIG. 15 shows a top and side view of a USB memory card 590, in accordance with another embodiment of the present invention. The USB memory card 590 is shown to include a tube metal housing 612, carrier substrate 606, and a COB-USB device 609. The carrier substrate 606 has a protruded rim plate protruded rim plate 602, which is shown in further detail and discussed relative to FIG. 16. The COB-USB device 609 is shown substantially enclosed and therefore protracted by the tube metal housing 612 but exposed at the front side of the tube metal housing 612 where the tube metal housing 612 is shown open. The tube metal housing 612 is generally rectangular and hollow in shape but may be other types of shapes in other embodiments. The tube metal housing 612 is made of metal.

In an exemplary application, the USB memory card 590 is removably connectable to a host device, such as PC or an electronic consumer device for storing information in memory included in the COB-USB device 609.

The USB memory card 590 is a compact device in large part due to the use of COB, which requires no leads or wires for connecting electrical components. The USB card sub-assembly 612 serves to protect the COB-USB device 609 by encompassing the latter and is made of metal. In a manner consistent with the foregoing, a user of the USB memory card 590 connects or plugs the USB memory card 590 into a host for operation thereof. The COB-USB device 609 is analogous to the COB-USB device 409, COB-USB device 209 and the COB-USB device 309. The COB-USB device 609 after is it has been placed onto a substrate is inserted into the holes 613 from the front side of the holes 613 and pushed therein until the front block 607 lines up with the cut holes 617 of the metal housing 612. Upon such insertion, the assembly is heated to a temperature that cures a thermal tape securing the COB-USB device 609 onto its substrate.

The metal housing 612 is shown to have a tube metal housing top surface 630 onto which are disposed two holes 613 at a tube metal housing front portion 64 of the metal housing 612. Two more holes 613, or holes 615 are disposed on the bottom surface of the metal housing 612, not shown in FIG. 15. At the tube metal housing front portion 64 of the USB card sub-assembly 612 is also shown disposed a tube metal housing front portion 614, which is merely a directional pointer to guide users of the USB memory card 590 to insert the USB memory card 590 into a host in a direction consistent with the direction of the tube metal housing front portion 614.

FIG. 16 shows further details of relevant components comprising the USB memory card 590. The USB memory card 590 is shown to include a USB card sub-assembly 62 comprising the carrier substrate 606 and the COB-USB device 609. The carrier substrate 606 is shown to include a U-block 600, a protruded rim plate protruded rim plate 602, a cavity hole 603, a rectangular depression 604, and a thermo set adhesive tape 605.

The COB-USB device 609 is similar to and functions in the same manner as the COB-USB device 409, COB-USB device 309 and the COB-USB device 209.

The metal housing 612 is shown to include two holes 613 and two holes 615, the tube metal housing front portion 614, and a tube metal housing back portion 16, The two holes 613 are disposed on either side of the top of the metal housing 612 at its tube metal housing front portion 64, as is the tube metal housing front portion 614. The metal housing 612 is generally a hollow rectangular cube. On the bottom surface of the metal housing 612 is disposed the two holes 615 in like positions as their counterparts holes 613 and the tube metal housing back portion 616. The four holes 613 and holes 615 of the metal housing 612 hold the USB memory card 590 in place when the USB memory card 590 is positioned in a host.

The U-block 600 protrudes from a back side of the carrier substrate 606 and extends partially above the bottom surface of the carrier substrate 606 forming a U-shaped structure and has a indentation on a front surface thereof forming the cavity hole 603, which is a space into which the LED 608 is placed.

The carrier substrate 606 is generally a single chip carrier substrate and in this connection, the COB-USB device 609 is a single chip COB-USB device although it is appreciated that other than a single-chip substrate and device may be employed.

The rectangular depression 604 is generally shallow to allow for lesser thermal tape requirements. The rectangular depression 604 houses the thermo set adhesive tape 605, which comes up to approximately 70-80% of the height of the rectangular depression 604. After the USB memory card 590 is assembled, it is heated to thermally seal the COB-USB device 609 to the carrier substrate 606. In one embodiment of the present invention, the carrier substrate 606 is molded from thermo set plastic material The rectangular depression 604 is a thin, long rectangular floor having the length, width and height designed to accommodate the dimensions of the COB-USB device 609. The rectangular depression 604 is generally made to allow the thermo set adhesive tape 605 to place on and to sink in about 80% of the tape thickness.

The protruded rim plate protruded rim plate 602 is generally a backend vertically-erected structure, which serves as a stopper to cap off the back end of the metal housing 612. The U-block 600 is raised at a height equal to the thickness of the COB-COB-USB device 609. The cavity hole 603 serves to house the LED 608. Corresponding to the cavity hole 603, there is a translucent window on the back surface of the protruded rim plate protruded rim plate 602, shown in a subsequent figure, to allow the LED light to cast on it.

The COB-USB device 609 is assembled using the combination of SMT and COB assembly processes, which are well known to those of ordinary skill in the art. Details of fabricating this single chip COB-USB is described in CIP reference application U.S. Ser. No. 11/773,830 filed Jul. 5, 2007 titled, "Molding Method to Manufacture Single-Chip Chip-On-Board USB Device". An LED 608 is surface-mounted on the back end of the COB-USB device 609.

The thermo set adhesive tape 605 is generally a thin film or thermal tape causing adhering the COB-USB device 609 onto the rectangular depression 604 of the carrier substrate 606. The metal housing 612 is generally a sheet metal folded and rectangular tube. This metal housing is made of steel material, in one embodiment of the present invention and can be plated with bright and shinny chromium or gold. There are four holes 613 and holes 615, which in one embodiment of the present invention, are rectangular-shaped and at the front end are designed to lock in place with metal pins of a host when connected thereto. The tube metal housing front portion 614 is triangular in shape to point to a direction indicative of the direction in which the USB memory card 590 is inserted to connect the USB memory card 590 to a host and is thus a directional pointer to guide users. The tube metal housing back portion 616 is to interlock the sheet metal from which the USB card sub-assembly 612 is made so that it has a more sturdy structure.

The thermo set adhesive tape 605 is typically double sided in that the thermo tape is on both sides of the thermo set adhesive tape 605 so as to cause the COB-USB device 609 to be taped securely to the carrier substrate 606.

To assembly USB memory card 590, first, the USB card sub-assembly 62 is formed with the thermo set adhesive tape 605 being taped onto the rectangular depression 604 of the carrier substrate 606. Then the COB-USB device 609 is slid carefully, without chipping of the LED 608, onto the carrier substrate 606 to sit on top of the carrier substrate 606 and then pressed down to stick on the adhesive tape of the thermo set adhesive tape 605. The USB card sub-assembly 62 is then slid into the rear end of the metal housing 612, through the hollow front side of the metal housing 612.

The tube metal housing back portion 616 are square-wave like edges interlocking each other when the metal housing 612 is formed of a sheet metal to form a hollow rectangular pipe of the sheet metal. The holes 615 are located in like location as that of the holes 613 on the bottom surface of the metal housing 612 much in the same manner as discussed relative to the holes 215 and holes 213 of FIG. 2.

To summarize, the carrier substrate 606 is molded from thermo set plastic materials and consists of a thin, long rectangular floor having the length, width and height that is designed to accommodate the dimensions of the COB-USB device 609. The rectangular depression 604 is made to allow the thermo set adhesive tape 605 to place on and to sink in approximately 70-80% of the tape thickness. A backend vertically erected structure consists of the protruded rim plate protruded rim plate 602 which serves as a stopper to cap off the back end of the metal housing 612. The U-block 600 is raised at a height equal to the thickness of the COB-USB device 609. The cavity hole 603 serves to house the LED 608. Corresponding to this cavity hole, there is a translucent window on the back surface of the protruded rim plate protruded rim plate 602 to allow the LED light to cast on it. The COB-USB device 609 is made in the same manner as the COB-USB device 209. The thermo set adhesive tape 605 causes adhering the COB-USB device 609 onto the rectangular depression 604 of the carrier substrate 606. The metal housing 612 is made of a sheet metal folded into a rectangular tube metal housing, as shown relative to FIGS. 3-5 relative to the tube metal housing 212. The metal housing 612 is made of steel material and is plated with bright and shinny chromium or gold. There are four rectangular holes 613 and holes 615 at the tube metal housing front portion 64 of the metal housing 612 designed to lock the metal housing 612 in place with the metal pins in a host system when connected. The tube metal housing front portion 614 is a triangular depression mark serving as a directional pointer to guide users for coupling the USB memory card 590 to a host. The tube metal housing back portion 616 serves to interlock the sheet metal from which the metal housing 612 is made so that it has a more sturdy structure.

The assembly the USB memory card 590, the thermo set adhesive tape 605 is taped onto the rectangular depression 604 of the carrier substrate 606. Then the COB-USB device 609 is slid carefully, without chipping of the LED 608, into the carrier substrate 606 and then pressed down to stick on the rectangular depression 604 to form the USB card sub-assembly 62. The USB card sub-assembly 62 is then slid into the rear end of the metal housing 612 through the hollow front side of the metal housing 612. The completed USB memory card then is passed through a temperature curing oven to cure the thermo set adhesive tape 605 to form the USB memory card 590.

FIG. 17 shows a top and side view of a USB memory card 690, in accordance with another embodiment of the present invention. The USB memory card 690 is shown to include a tube metal housing 712, carrier substrate 706, and a COB-USB device 709. The COB-USB device 709 is shown substantially enclosed and therefore protracted by the metal housing 712 but exposed at the front side of the metal housing 712 where the metal housing 712 is shown open. The metal housing 712 is generally rectangular and hollow in shape but may be other types of shapes in other embodiments. The metal housing 712 is made of metal.

In an exemplary application, the USB memory card 690 is removably connectable to a host device, such as PC or an electronic consumer device for storing information in memory included in the COB-USB device 709.

The carrier substrate 706 is shown to have a front block 707 that is a partially raised portion of the carrier substrate 706 serving as stoppage for the COB-USB device 709 disallowing the latter from slipping out of the metal housing 712.

The USB memory card 690 is a compact device in large part due to the use of COB, which requires no leads or wires for connecting electrical components. The metal housing 712 serves to protect the COB-USB device 709 by encompassing the latter and is made of metal in a manner consistent with the foregoing, a user of the USB memory card 690 connects or plugs the USB memory card 690 into a host for operation thereof. The COB-USB device 709 is analogous to the COB-USB device 209. The COB-USB device 709 after is it has been placed onto a substrate is inserted into the holes 713 from the front side of the holes 713. Upon such insertion, the assembly is heated to a temperature that cures a thermal tape securing the COB-USB device 709 onto its substrate.

The metal housing 712 is shown to have a tube metal housing top surface 730 onto which are disposed two holes 713 at a tube metal housing front portion 74 of the metal housing 712. Two more holes 713s, or holes 715s, are disposed on the bottom surface of the metal housing 712, not shown in FIG. 17. At the tube metal housing front portion 74 of the metal housing 712 is also shown disposed a tube metal housing front portion 714, which is merely a directional pointer to guide users of the USB memory card 690 to insert the USB memory card 690 into a host in a direction consistent with the direction of the tube metal housing front portion 714.

The carrier substrate 706 is shown to have a front block 707 that is a partially raised portion of the carrier substrate 706 serving as stoppage for the COB-USB device 709 disallowing the latter from slipping out of the metal housing 712.

The metal housing 712 is shown to have a tube metal housing top surface 730 onto which are disposed two holes 713 at a tube metal housing front portion 74 of the metal housing 712 and two recesses (or fasteners) 701 disposed at a tube metal housing back portion 76 of the metal housing 712. As will become apparent shortly, the recesses (or fasteners) 701 are each made of a recess into which a notch is positioned to secure the back end of the USB memory card 690. Two more holes 713, or holes 715 are disposed on the bottom surface of the metal housing 712, not shown in FIG. 17. At the tube metal housing front portion 74 of the metal housing 712 is also shown disposed a tube metal housing front portion 714, which is merely a directional pointer to guide users of the USB memory card 690 to insert the USB memory card 690 into a host in a direction consistent with the direction of the tube metal housing front portion 714.

FIG. 18 shows further details of relevant components comprising the USB memory card 690. The USB memory card 690 is shown to include a USB card sub-assembly 72 comprising the carrier substrate 706 and the COB-USB device 709. The carrier substrate 706 is shown to include a U-block 700, a recesses (or fasteners) 701, a protruded rim plate protruded rim plate 702, a cavity hole 703, a rectangular depression 704, a thermo set adhesive tape 705, a front rectangular block 718, a thermo set adhesive tape 705 and a front block 707.

The COB-USB device 709 is similar to and functions in the same manner as the COB-USB device 409, COB-USB device 309 and the COB-USB device 209.

The metal housing 712 is shown to include two notches 711s, two holes 713 and two holes 715, the tube metal housing front portion 714, and a tube metal housing back portion 716. The two notches 711 are disposed on either side of the top of the metal housing 712 at its tube metal housing back portion 76 and the two holes 713 are disposed on either side of the top of the metal housing 712 at its tube metal housing front portion 74, as is the tube metal housing front portion 714. The metal housing 712 is generally a hollow rectangular cube. On the bottom surface of the metal housing 712 is disposed the two holes 715 in like positions as their counterparts holes 713 and the 7 tube metal housing back portion 16. The four holes 713 and holes 715 of the metal housing 712 hold the USB memory card 690 in place when the USB memory card 690 is positioned in a host.

The two recesses (or fasteners) 701s of the carrier substrate 706 are dispersed onto the top of the U-block 700 at either side and serve to hold respective notches 711 of the metal housing 712 in place to secure the USB card sub-assembly 72 within the metal housing 712. The U-block 700 protrudes from a back side of the carrier substrate 706 and extends partially above the bottom surface of the carrier substrate 706 forming a U-shaped structure and has a indentation on a front surface thereof forming the cavity hole 703, which is a space into which the LED 708 is placed.

The carrier substrate 706 is shown to have a front block 707 that is a partially raised portion of the carrier substrate 706 serving as stoppage for the COB-USB device 709 disallowing the latter from slipping out of the metal housing 712.

The carrier substrate 706 is generally a single chip carrier substrate and in this connection, the COB-USB device 709 is a single chip COB-USB device although it is appreciated that other than a single-chip substrate and device may be employed.

The rectangular depression 704 is generally shallow to allow for lesser thermal tape requirements. The rectangular depression 704 houses the thermo set adhesive tape 705, which comes up to approximately 70-80% of the height of the rectangular depression 704. The rectangular depression 704 is generally shallow to allow for lesser thermal tape requirements. The rectangular depression 704 includes two hole slots 719 that are each long rectangular hole slots intentionally made to allow the thermo set adhesive tape to melt and to flow down to the metal housing 712's bottom inner surface to make better adhesive bonding with the metal housing 712 during the thermal cure cycle.

After the USB memory card 490 is assembled, it is heated to thermally seal the COB-USB device 709 to the carrier substrate 706. In one embodiment of the present invention, the carrier substrate 706 is molded from thermo set plastic material. The rectangular depression 704 is generally a thin, long rectangular floor having the length, width and height designed to accommodate the dimensions of the COB-USB device 709. The rectangular depression 704 is generally made to allow the thermo set adhesive tape 705 to place on and to sink in about 70-80% of the tape thickness. A front block 707 is designed to hold the front edge of the connector end of the COB-USB device 709.

The protruded rim plate protruded rim plate 702 is generally a backend vertically-erected structure, which serves as a stopper to cap off the rear end of the 7USB card sub-assembly 12. The recesses (or fasteners) 701 on the U-block 700 are designed to lock tight with the notches 711 near the rear end surface of the metal housing 712. The U-block 700 is raised at a height equal to the thickness of the COB-USB device 709. The cavity hole 703 serves to house the LED 708. Corresponding to the cavity hole 703, there is a translucent window on the back surface of the protruded rim plate protruded rim plate 702, shown in a subsequent figure, to allow the LED light to cast on it.

The COB-USB device 709 is assembled using the combination of SMT and COB assembly processes, which are well known to those of ordinary skill in the art. Details of fabricating this single chip COB-USB is described in CIP reference application U.S. Ser. No. 11/773,830 filed Jul. 5, 2007 titled, "Molding Method to Manufacture Single-Chip Chip-On-Board USB Device". An LED 208 is surface-mounted on the back end of the COB-USB device 209.

The thermo set adhesive tape 705 is generally a thin film or thermal tape for adhering the COB-USB device 709 onto the rectangular depression 704 of the carrier substrate 706. The metal housing 712 is generally a sheet metal folded and rectangular tube. This metal housing is made of steel material, in one embodiment of the present invention and can be plated with bright and shinny chromium or gold. The two notches 711 located near the tube metal housing back portion 76 of the metal housing 712 serves to latch onto the two recesses (or fasteners) 701s on the U-block 700. There are four holes 713 and holes 715, which in one embodiment of the present invention, are rectangular-shaped and at the front end are designed to lock in place with metal pins of a host when connected thereto. The tube metal housing front portion 714 is triangular in shape to point to a direction indicative of the direction in which the USB memory card 390 is inserted to connect the USB memory card 390 to a host and is thus a directional pointer to guide users. The tube metal housing back portion 716 is to interlock the sheet metal from which the metal housing 712 is made so that it has a more sturdy structure.

The thermo set adhesive tape 705 is typically double sided in that the thermo tape is on both sides of the thermo set adhesive tape 705 so as to cause the COB-USB device 709 to be taped securely to the carrier substrate 706.

The COB-USB device 709, after it has been placed onto a substrate, is inserted into the holes 713 from the front side of the holes 713 and pushed therein. Upon such insertion, the assembly is heated to a temperature that cures a thermal tape securing the COB-USB device 709 onto its substrate.

The front block 707 of the carrier substrate 706 fits into the hollow front side of the metal housing 712 when the USB card sub-assembly 72 is positioned into the metal housing 712. The front rectangular block 707 is designed to be held at the front edge of the connector end of the COB-USB device 709.

To assemble USB memory card 690, first, the USB card sub-assembly 72 is formed with the thermo set adhesive tape 705 being taped onto the rectangular depression 704 of the carrier substrate 706. Then the COB-USB device 709 is slid carefully, without chipping of the LED 708, onto the carrier substrate 706 to sit between the front block 707 and below the U-block 700 on top of the carrier substrate 706 and then pressed down to stick on the adhesive tape of the thermo set adhesive tape 705. The USB card sub-assembly 72 is then slid into the rear end of the metal housing 712, through the hollow front side of the metal housing 712, and pushed so that the front block 707 sits against the inside of the metal housing 712.

The tube metal housing back portion 716 are square-wave like edges interlocking each other when the metal housing 712 is formed of a sheet metal to form a hollow rectangular pipe of the sheet metal. The holes 715 are located in like location as that of the holes 713 on the bottom surface of the metal housing 712 much in the same manner as discussed relative to the holes 215 and holes 213 of FIG. 2.

To summarize, the carrier substrate 706 is molded from thermo set plastic materials that consist of a thin, long rectangular floor has the length, width and height that designed to accommodate the dimensions of the COB-USB device 709. The rectangular depression 704 is generally rectangular and shallow and made to allow the thermo set adhesive tape 705 to be placed thereon and to sink in approximately 70-80% of the tape thickness. The hole slots 719 are intentionally made to allow the thermo set adhesive tape to melt and to flow down to the metal case bottom inner surface to make better adhesive bonding with the metal housing during the thermal cure cycle. A backend vertically erected structure consists of the U-block 700, which is raised at a height equal to the thickness of the COB-USB device 709. There are two recesses (or fasteners) 701 on the U-block 700 which is designed to lock tight with the notches 711 near the rear end surface of the rectangular tube-shaped metal housing 712. The cavity hole 703 serves to house the LED. The U-block 700 allows the LED light to cast on it. The COB-USB device 709, in one embodiment of the present invention, is a single chip COB-USB block, which is assembled using the combination of SMT and COB assembly processes. Details of fabricating this single chip COB-USB is described in CIP reference application U.S. Ser. No. 11/773, 870 filed Jul. 5, 7007 titled, "Molding Method to Manufacture Single-Chip Chip-On-Board USB Device". An LED 708 is surface mounted on the rear end of the COB-USB device 709. The thermo set adhesive tape 705 is double-sided and made for adhering the COB-USB device 709 onto the rectangular depression 704 of the carrier substrate 706. The metal housing 712 is generally made of steel material and plated with bright and shinny chromium or gold, in one embodiment of the present invention. The four holes 713 and holes 715, disposed at the tube metal housing front portion 74 of the metal housing 712, are designed to lock into place with metal pins in a host system when connected to the host. The tube metal housing front portion 714 is a directional pointer to guide users to insert the USB memory card 690 in the direction of the arrow when the USB memory card 690 is being coupled to a host. The tube metal housing back portion 716 serves to interlock the sheet metal so that it has a more sturdy structure.

In assembling the USB memory card 690, the double sided thermo set adhesive tape 705 is taped onto the shallow rectangular depression 704 of the carrier substrate 706. Then the COB-USB device 709 is slid carefully without chipping of the LED 708 and then pressed down to stick on the adhesive tape to form the USB card sub-assembly 72. The metal housing 712 is then slid into the rear end of the metal housing 712 through the hollow front side of the metal housing 712. The completed USB memory card then pass through a temperature curing oven to cure the thermo set adhesive tape 705 to form the USB memory card 690.

Although the present invention has been described in terms of specific embodiment, it is anticipated that alterations and modifications thereof will no doubt become apparent to those more skilled in the art. It is therefore intended that the following claims be interpreted as covering all such alterations and modification as fall within the true spirit and scope of the invention.

What is claimed is:

1. A removably connectable Universal Serial Bus (USB) memory card comprising:
   rectangularly-shaped tube metal housing;
   Chip-On-Board (COB)-USB device;

carrier substrate having a U-block disposed on one side thereof and protruding from a back side of the carrier substrate and extending partially above the bottom surface of the carrier substrate forming a U-shaped structure;

a rectangular depression formed in the bottom surface of the carrier substrate, for receiving a thermo set adhesion tape that causes the COB-USB device to be thermally taped to the carrier substrate when heated, the carrier substrate and the COB-USB device forming a USB card sub-assembly, the USB card sub-assembly being securely located inside the rectangularly-shaped tube metal housing with the U-block serving to stop the COB-USB device from slipping out of the metal housing, wherein a light-emitting diode (LED) is disposed substantially on the top of the COB-USB device and on a side thereof that is below the U-block, a LED window made of transparent plastic disposed substantially in the middle of the back side of the metal housing;

a cavity hole disposed substantially on the bottom center of the U-block, wherein the LED is housed inside the cavity hole when the COB-USB device is inserted into the carrier substrate, and the LED window allows emitting light from the LED to travel through the inside of the USB memory card sub-assembly thereby indicating that the USB memory card is active when lit, and inactive when not lit.

2. A removably connectable USB memory card, as recited in claim 1, wherein the COB-USB device is a single chip.

3. A USB memory card, as recited in claim 1, wherein the carrier substrate is a single chip carrier substrate.

4. A USB memory card, as recited in claim 1, wherein contact fingers are disposed on the top front side of the COB-USB device.

5. A USB memory card, as recited in claim 1, further comprising:
a rectangular front block disposed on the top front side of the carrier substrate;
protruding rectangularly-shaped horns disposed substantially in the middle of the vertical sides of the rectangular front block,
wherein the horns fit substantially flush with corresponding cut holes disposed on the vertical sides of the metal housing, thereby positioning the USB card sub-assembly substantially securely within the metal housing.

6. A USB memory card, as recited in claim 1, further comprising:
two depressions disposed on substantially the top of the U-block; and
a pair of notches disposed on substantially either side of the top of the metal housing, wherein the pair of notches secure the back end of the USB memory card inside the metal housing when the pair of notches are fit substantially securely inside the two depressions disposed on the top of the U-block.

7. A USB memory card, as recited in claim 1, wherein the rectangular depression includes two hole slots disposed substantially on opposite sides of the depression, and said hole slots serve to allow the thermo set adhesive tape to melt and flow down to the bottom surface of the metal housing.

8. A removably connectable USB memory card, as recited in claim 1, wherein the rectangular depression houses the thermo set adhesive tape and when housed in the rectangular depression, the thermo set adhesive tape comes up to approximately 70 to 80% of the height of the rectangular depression.

9. A removably connectable USB memory card, as recited in claim 1, further including a protruded rim plate extending vertically upwards from the surface of the carrier substrate and forming the back side of the carrier substrate where the U-block protrudes from and serving as a stopper to cap off the rear end of the tube metal housing USB card sub-assembly when the tube metal housing USB card sub-assembly is inside of the rectangularly-shaped tube metal housing.

10. A removably connectable USB memory card, as recited in claim 9, wherein the rectangularly-shaped tube metal housing further includes at least two notches disposed on either side of a top side of the rectangularly-shaped tube metal housing.

11. A removably connectable USB memory card, as recited in claim 10, wherein at least two recesses are dispersed onto the top of the U-block at either side thereof, the at least two recesses operative to hold a respective one of the at least two notches in place to secure the USB card sub-assembly within the USB card sub-assembly, the at least two recesses being operative to lock tight with the at least two notches near the rear end surface of the USB card sub-assembly.

12. A removably connectable USB memory card, as recited in claim 11, wherein the carrier substrate has a front block extended upwardly from the bottom surface of the carrier substrate on a side thereof that is opposite to the side where the U-block is formed, the front block operative to hold a front edge of a connector end of the COB-USB device.

13. A removably connectable Universal Serial Bus (USB) memory card comprising:
housing means for housing a Chip-On-Board (COB)-USB device;
carrier substrate means having a U-block disposed on one side thereof and protruding from a back side of the carrier substrate and extending partially above the bottom surface of the carrier substrate forming a U-shaped structure;
depression means formed in the bottom surface of the carrier substrate, for receiving a thermo set adhesion tape that causes the COB-USB device to be thermally taped to the carrier substrate when heated, the carrier substrate and the COB-USB device forming a USB card sub-assembly, the USB card sub-assembly being securely located inside the housing means with the U-block serving to stop the COB-USB device from slipping out of the housing means
light emitting means disposed substantially on the top of the COB-USB device and on a side thereof that is below the U-block; and
LED window means made of transparent plastic disposed substantially in the middle of the back side of the housing means;
cavity hole means disposed substantially on the bottom center of the U-block;
wherein the LED is housed inside the cavity hole when the COB-USB device is inserted into the carrier substrate, and the LED window means allows emitting light from the LED to travel through the inside of the USB memory card sub-assembly thereby indicating that the USB memory card is active when lit, and inactive when not lit.

14. A USB memory card, as recited in claim 13, wherein the COB-USB device is a single chip.

15. A USB memory card, as recited in claim 13, wherein the carrier substrate means is a single chip carrier substrate.

16. A USB memory card as recited in claim 13, further comprising contact fingers means disposed on the top front side of the COB-USB device.

17. A USB memory card as recited in claim 13, further comprising;
- a rectangular front block means disposed on the top front side of the carrier substrate; and
- a protruding rectangularly-shaped horn means disposed substantially in the middle of the vertical sides of the rectangular front block, wherein the horn means fit substantially flush with corresponding cut holes disposed on the vertical sides of the metal housing, thereby positioning the USB card sub-assembly substantially securely within the metal housing.

18. A USB memory card as recited in claim 13, further comprising:
- depression means disposed on substantially the top of the U-block; and
- notch means disposed on substantially either side of the top of the metal housing, wherein the notch means secure the back end of the USB memory card inside the metal housing when the notch means are fit substantially securely inside the depressions depression means disposed on the top of the U-block.

19. A USB memory card as recited in claim 13, wherein the rectangular depression means includes two hole slots disposed substantially on opposite sides of the depression, and said hole slots serve to allow the thermo set adhesive tape to melt and flow down to the bottom surface of the housing means.

* * * * *